United States Patent
Khosla et al.

(10) Patent No.: US 8,557,385 B2
(45) Date of Patent: Oct. 15, 2013

(54) ELECTRICALLY CONDUCTIVE, THERMOSETTING ELASTOMERIC MATERIAL AND USES THEREFOR

(71) Applicants: Ajit Khosla, Burnaby (CA); Bonnie Lynne Gray, Vancouver (CA)

(72) Inventors: Ajit Khosla, Burnaby (CA); Bonnie Lynne Gray, Vancouver (CA)

(73) Assignee: Simon Fraser University, Burnaby (CA)

(*) Notice: Subject to any disclaimer, the term of this patent is extended or adjusted under 35 U.S.C. 154(b) by 0 days.

(21) Appl. No.: 13/728,325

(22) Filed: Dec. 27, 2012

(65) Prior Publication Data

US 2013/0126216 A1 May 23, 2013

Related U.S. Application Data

(63) Continuation of application No. 12/617,719, filed on Nov. 12, 2009, now Pat. No. 8,357,858.

(60) Provisional application No. 61/113,998, filed on Nov. 12, 2008.

(51) Int. Cl.
| | |
|---|---|
| *H05K 1/11* | (2006.01) |
| *B32B 9/04* | (2006.01) |
| *B29C 39/00* | (2006.01) |
| *B29C 39/12* | (2006.01) |
| *H01B 1/12* | (2006.01) |
| *H01B 1/04* | (2006.01) |

(52) U.S. Cl.
USPC ........ 428/411.1; 264/299; 264/255; 264/241; 252/500; 252/511; 252/514; 252/512; 252/519.1

(58) Field of Classification Search
None
See application file for complete search history.

(56) References Cited

U.S. PATENT DOCUMENTS

| | | | | |
|---|---|---|---|---|
| 3,598,693 A | * | 8/1971 | Anderson et al. | 428/221 |
| 4,431,764 A | * | 2/1984 | Yoshizumi | 524/409 |
| 5,035,926 A | | 7/1991 | Jonas et al. | |
| 5,259,990 A | | 11/1993 | Schluetter et al. | |
| 5,300,575 A | | 4/1994 | Jonas et al. | |
| 5,403,467 A | | 4/1995 | Jonas et al. | |
| 5,457,013 A | * | 10/1995 | Christian et al. | 430/496 |
| 5,482,655 A | | 1/1996 | Vogel et al. | |
| 5,700,398 A | * | 12/1997 | Angelopoulos et al. | 252/500 |
| 5,721,299 A | * | 2/1998 | Angelopoulos et al. | 524/177 |
| 5,766,515 A | | 6/1998 | Jonas et al. | |
| 5,935,405 A | | 8/1999 | Wolf et al. | |
| 5,973,050 A | | 10/1999 | Johnson et al. | |
| 5,997,773 A | * | 12/1999 | Angelopoulos et al. | 252/511 |
| 6,149,840 A | | 11/2000 | Ardakani et al. | |
| 6,187,522 B1 | * | 2/2001 | Majumdar et al. | 430/527 |

(Continued)

OTHER PUBLICATIONS

Sahoo et al. "Influence of carbon nanotubes and polypyrrole on the thermal, mechanical and electroactive shape-memory properties of polyurethane nanocomposites" Composites Science and Technology 67, 2007, 1920-1929.*

(Continued)

*Primary Examiner* — Robert S Loewe
(74) *Attorney, Agent, or Firm* — Oyen Wiggs Green & Mutala LLP

(57) ABSTRACT

An electrically conductive, thermosetting elastomeric composition is provided. The composition may comprise: an initially substantially non-electrically conductive, thermosetting base polymer; a particulate filler comprising electrically conductive particles; and an electrically conductive polymer additive. The non-electrically conductive, thermosetting base polymer, the particulate filler and the electrically conductive polymer additive are mixed substantially macroscopically homogeneously.

33 Claims, 11 Drawing Sheets

(56) References Cited

U.S. PATENT DOCUMENTS

| | | | |
|---|---|---|---|
| 6,201,051 B1 | 3/2001 | Mager et al. | |
| 6,410,199 B1* | 6/2002 | Ikeuchi et al. | 430/124.54 |
| 6,528,572 B1* | 3/2003 | Patel et al. | 524/495 |
| 6,617,377 B2 | 9/2003 | Chacko | |
| 6,638,448 B2 | 10/2003 | Karttunen et al. | |
| 6,912,113 B2 | 6/2005 | Kumar et al. | |
| 6,936,191 B2 | 8/2005 | Fox et al. | |
| 7,074,348 B2* | 7/2006 | Geer et al. | 252/500 |
| 7,118,693 B2* | 10/2006 | Glatkowski et al. | 252/502 |
| 7,118,836 B2 | 10/2006 | Andriessen | |
| 7,250,454 B2 | 7/2007 | Yadav et al. | |
| 7,304,107 B2 | 12/2007 | Alms et al. | |
| 7,662,314 B2 | 2/2010 | Han et al. | |
| 7,850,870 B2* | 12/2010 | Ahn et al. | 252/500 |
| 7,880,164 B2 | 2/2011 | Lee et al. | |
| 8,004,177 B2 | 8/2011 | Lee et al. | |
| 8,435,676 B2* | 5/2013 | Zhamu et al. | 429/231.8 |
| 2004/0071949 A1* | 4/2004 | Glatkowski et al. | 428/313.3 |
| 2005/0209392 A1* | 9/2005 | Luo et al. | 524/496 |
| 2006/0083948 A1* | 4/2006 | Kawaguchi et al. | 428/692.1 |
| 2006/0223927 A1* | 10/2006 | Hodjat et al. | 524/405 |
| 2007/0246246 A1 | 10/2007 | Vilkmann et al. | |
| 2007/0246689 A1 | 10/2007 | Ge et al. | |
| 2008/0004396 A1* | 1/2008 | Lee et al. | 524/847 |

OTHER PUBLICATIONS

Njuguna et al. "Recent developments in polyurethane-based conducting composites" Journal of Materials Science, 39, 2004, 4081-4094.*

Tellakula et al. "Carbon fiber and nanotube based composties with polypyrrole fabric as electromagnetic absorbers" Smart Mater. Struct. 13, 2004, 1040-1044.*

Sahoo et al. "Electroactive Shape Memory Effect of Polyurethane Composites Filled with Carbon Nanotubes and Conducting Polymer" Materials and Manufacturing Processes 22, 419-423, 2007.*

Baytron FHC Product Specification (H.C. Starck), Published prior to Nov. 12, 2008.

Clevios Product Specification (H.C. Starck), Published prior to Nov. 12, 2008.

Material Safety Data Sheet for Dow Corning Sealant 734, 9 pages, 2012.

* cited by examiner

ELECTRICALLY CONDUCTIVE, THERMOSETTING ELASTOMERIC MATERIAL AND USES THEREFOR

RELATED APPLICATIONS

This application is a continuation of U.S. application Ser. No. 12/617,719 filed 12 Nov. 2009, which in turn claims the benefit of the priority of U.S. application No. 61/113,998 filed 12 Nov. 2008. Both application Ser. No. 12/617,719 and application No. 61/113,998 are hereby incorporated herein by reference.

TECHNICAL FIELD

This invention relates generally to thermosetting polymers. Particular embodiments provide electrically conductive, thermosetting elastomeric compositions, uses therefor and methods for fabricating structures comprising same.

BRIEF DESCRIPTION OF DRAWINGS

Exemplary embodiments are illustrated in referenced figures of the drawings. It is intended that the embodiments and figures disclosed herein are to be considered illustrative rather than restrictive.

DESCRIPTION

Figure 1A:
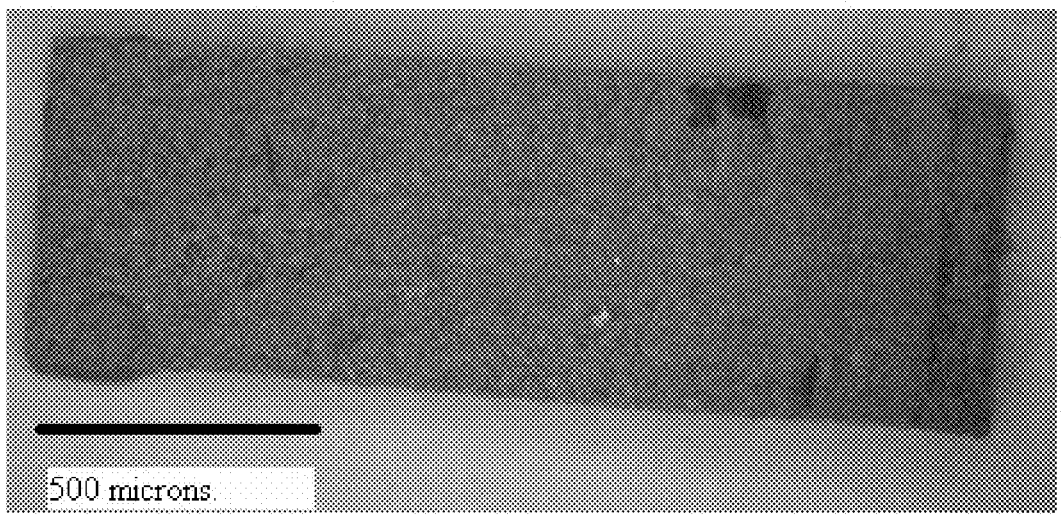
FIGS. 1A, 1B and 1C are photographs which illustrate the flexibility of a sample structure fabricated from an electrically conductive, thermosetting elastomeric composition according to a particular example embodiment

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Aspects of the invention provide electrically conductive, thermosetting elastomeric compositions. In particular embodiments, the electrically conductive, thermosetting elastomeric compositions comprise suitable combinations of: an initially substantially non-electrically conductive, thermosetting base polymer; a conductive particulate filler (e.g. microparticles or nanoparticles); and a conductive polymer additive. The non-conductive thermosetting base polymer, conductive particulate filler and conductive polymer additive may be mixed substantially homogeneously. In some embodiments, the composition may further comprise a curing agent, a diluting agent or both.

In some embodiments, the non-conductive thermosetting base polymer comprises one or more of: a silicone-based elastomer and a polyurethane-based elastomer. In some embodiments, the non-conductive thermosetting base polymer comprises one or more of: PDMS, Sealant 734™ and polyurethane-based elastomer. In some embodiments, the non-conductive thermosetting base polymer comprises contact cement. In some embodiments, the particulate filler comprises one or more of: metal-based microparticles, metal-based nanoparticles, carbon-based microparticles and carbon-based nanoparticles. In some embodiments, the metal-based microparticles or metal-based nanoparticles comprise silver microparticles or silver nanoparticles. In some embodiments, an aspect ratio of a maximum dimension to a minimum dimension of the metal-based microparticles or metal-based nanoparticles is greater than or equal to 50:1. In some embodiments, an aspect ratio of a maximum dimension to a minimum dimension of the carbon-based microparticles or carbon-based nanoparticles is greater than or equal to 250:1. In some embodiments, the conductive polymer additive comprises one or more of: PEDOT and PEDOT/PSS.

In particular embodiments having metal-based particulate filler materials, the concentration of particulate filler material in the resultant electrically conductive, thermosetting elastomeric composition is less than 30% weight. In other embodiments having metal-based particulate filler materials, the concentration of particulate filler material in the resultant electrically conductive, thermosetting elastomeric composition is less than 15% weight. In still other embodiments having metal-based particulate filler materials, the concentration of particulate filler material in the resultant electrically conductive, thermosetting elastomeric composition is less than 10% weight. In particular embodiments having carbon-based particulate filler materials, the concentration of particulate filler material in the resultant electrically conductive, thermosetting elastomeric composition is less than 5% weight. In other embodiments having carbon-based particulate filler materials, the concentration of particulate filler material in the resultant electrically conductive, thermosetting elastomeric composition is less than 2% weight. In still other embodiments having carbon-based particulate filler materials, the concentration of particulate filler material in the resultant electrically conductive, thermosetting elastomeric composition is less than 1% weight. In yet other embodiments having carbon-based particulate filler materials, the concentration of particulate filler material in the resultant electrically conductive, thermosetting elastomeric composition is less than 0.2% weight.

Particular embodiments provide methods for preparing electrically conductive, thermosetting elastomeric structures comprising suitable combinations of: an initially substantially non-electrically conductive, thermosetting base polymer; a conductive particulate filler (e.g. microparticles or nanoparticles); and a conductive polymer additive. The non-conductive thermosetting base polymer, conductive particulate filler and conductive polymer additive may be mixed substantially homogeneously. As will be described further herein, example embodiments of electrically conductive, thermosetting compositions possess lower resistivity, higher flexibility and stretchability, and improved micromoldability relative to the known art.

Particular embodiments provide methods for micromolding structures using electrically conductive, thermosetting elastomeric compositions comprising combinations of: an initially substantially non-electrically conductive, thermosetting base polymer; a conductive particulate filler (e.g. microparticles or nanoparticles); and a conductive polymer additive. In particular embodiments, such methods comprise soft lithography techniques. Such methods may include fabricating micromolds using one or more iterations of UV exposure of a photoresist layer through a suitable mask and development of the resultant structure in a manner which impacts the exposed and unexposed photoresist in different manners.

Such methods may include one or more iterations of introducing the electrically conductive, thermosetting elastomeric composition to a mold and curing the electrically conductive, thermosetting elastomeric composition in the mold. Such methods may include layering one or more layers of electrically conductive, thermosetting elastomeric composition with one or more layers of substantially non-electrically conductive, thermosetting elastomeric material. The non-electrically conductive material may comprise the base polymer used in the electrically conductive composition. Layering one or more layers of electrically conductive composition with one or more layers of one or more layers of substantially non-electrically conductive material may involve one or more iterations of introducing the electrically conductive composition to a mold, curing the electrically conductive composition, introducing the non-electrically conductive material to the mold and curing the non-electrically conductive material.

Such methods may comprise: fabricating a first portion of a mold using soft lithography techniques; curing one or more first polymer layers in the first portion of the mold; fabricating a second portion of the mold in a location against the first portion of the mold and the one or more first polymer layers using soft lithography techniques; and curing one or more second polymer layers in the second portion of the mold; wherein at least one of the one or more first polymer layers and the one or more second polymer layers comprises the electrically conductive, thermosetting elastomeric composition. In some embodiments, at least one of the one or more first polymer layers and at least one of the one or more second polymer layers may comprise a non-electrically conductive thermosetting polymer.

Another aspect of the invention provides an electrically conductive, thermosetting elastomeric compositions comprising suitable combinations of: an initially substantially non-electrically conductive, thermosetting base polymer; and a metal-based particulate filler (e.g. microparticles or nanoparticles) wherein an aspect ratio of a maximum dimension to a minimum dimension of the metal-based particulate filler is greater than or equal to 50:1. In some embodiments, this aspect ratio is greater than or equal to 250:1. The non-conductive thermosetting base polymer and conductive particulate filler may be mixed substantially homogeneously. In some embodiments, the composition further comprises a conductive polymer additive. In some embodiments, the composition may further comprise a curing agent, a diluting agent or both. Methods of fabrication, applications and structures fabricated from this composition are also provided.

One aspect of the invention provides electrically conductive, thermosetting elastomeric compositions comprising suitable combinations of: an initially substantially non-electrically conductive, thermosetting base polymer; a conductive particulate filler (e.g. microparticles or nanoparticles); and a conductive polymer additive. The non-conductive thermosetting base polymer, conductive particulate filler and conductive polymer additive may be mixed substantially homogeneously.

In particular embodiments, the initially non-electrically conductive, thermosetting base polymer comprises a thermosetting, initially non-electrically conductive elastomer. The thermosetting, initially non-electrically conductive base polymer may comprise a silicone-based elastomer, such as, by way of non-limiting example: polydimethylsiloxane (PDMS); Sealant 734™ commercially available from Dow Corning (which may comprise ethyltriacetoxysilane, methyltriacetoxysilane, decamethylcyclopentasiloxane, octamethylcyclotetrasiloxane, acetic anhydride, acetic acid and/or dipropyl methane); and/or other silicone-based elastomers. Other non-limiting examples of suitable initially non-electrically conductive, thermosetting base polymers include: polyurethane-based elastomers and contact cement (such as the brand DAP™ Weldwood™ contact cement sold by DAP Products Inc. of Baltimore, Md., USA, LePage™ Pres-Tite™ contact cement sold by Henkel Corporation, Canada or the like). In some embodiments, initially non-conductive, thermosetting contact cement may comprise toluene, solvent naptha (petroleum), magnesium oxide and 2-butanone or toluene, N-hexane, acetone, and aliphatic petroleum distillate. In other embodiments, other initially non-electrically conductive elastomeric materials may be used to provide the base material. Such initially non-electrically conductive, thermosetting base materials may comprise other materials, such as, by way of non-limiting example, one or more of:

ethyltriacetoxysilane, methyltriacetoxysilane, decamethylcyclopentasiloxane, octamethylcyclotetrasiloxane, acetic anhydride, acetic acid and dipropyl methane. The above-described thermosetting, initially non-electrically conductive, base materials represent non-limiting examples of suitable base materials. In some embodiments, other elastomeric materials could be used to provide the base material, other thermosetting materials could be used to provide the base material and other initially non-electrically conductive materials could be used to provide the base material.

In particular embodiments, the particulate filler material may comprise metal-based microparticles and/or nanoparticles, carbon-based microparticles and/or nanoparticles and/or combinations thereof. As used herein, the term microparticles refers to particles having a minimum cross-sectional dimension greater than 1000 nm and the term nanoparticles refers to particles having a minimum cross-sectional dimension less than or equal to 1000 nm. For example, a generally spherical shaped silver particle having a minimum cross-sectional dimension of 1200 nm would be a microparticle, but a rod-shaped silver particle having a long dimension of 1200 nm, but a diameter (i.e. a minimum cross-sectional dimension) of 10 nm would be a nanoparticle.

Metal-based particulate filler materials may provide relatively high conductivity (as compared to carbon-based filler materials), while carbon-based particulate filler materials may provide relatively light weight (as compared to metal-based filler materials). In currently preferred embodiments, the particulate filler material is conductive. Metal-based microparticles or nanoparticles may comprise pure metals, metallic alloys or other compounds containing metals. Examples of metal-based micro or nanoparticles which may be used to provide particulate filler material include, without limitation, one or more of: silver, gold, platinum, copper, nickel, aluminum, zinc, molybdenum, cadmium, scandium, titanium, vanadium, chromium, manganese, iron, cobalt, yttrium, zirconium, niobium, tantalum, tungsten, lead and/or metallic compounds or alloys containing these and/or any other metallic compounds or alloys (e.g. indium tin oxide, terfenol-D, manganin, constantan or the like). Examples of carbon-based microparticles or nanoparticles include, without limitation, one or more of: carbon, graphene, graphite and/or fullerene.

In some embodiments having metal-based particulate fillers, the particles which make up the particulate filler material may have maximum dimensions on the order of 1000 nm. In other embodiments having metal-based particulate fillers, this maximum dimension may be on the order of 250 nm. In still other embodiments, this maximum dimension may be on the order of 100 nm. Carbon-based particles (e.g. carbon nanotubes and the like) have been reported with dimensions as high as 1000 μm and may soon be even higher. Particular embodiments of the invention may incorporate such large carbon-based particulate filler materials. In some embodiments having carbon-based particulate filler materials, the maximum dimensions may be on the order of 15 μm. In other embodiments having carbon-based particulate filler materials, the maximum dimensions may be on the order of 2 μm. In still other embodiments having carbon-based particulate filler materials, the maximum dimensions may be on the order of 500 nm. Without wishing to be bound by any particular theory, it is currently believed that using smaller particles for the particulate filler material may result in electrically conductive, thermosetting elastomeric compositions according to aspects of this invention that have relatively higher flexibility and lower resistivity.

In some embodiments, the particles which make up the particulate filler material may have particular shapes, such as any one or more of: flake shapes, fiber shapes, rod/wire shapes, single walled tube shapes (e.g. single walled carbon nano-tubes) and/or multi-walled tube shapes (e.g. multi-walled carbon nano-tubes). The shape of the particles may also be a factor in determining the flexibility and/or electrical conductivity of the resulting electrically conductive, thermosetting elastomeric material. In some embodiments having metal-based particulate filler materials, an aspect ratio of the maximum particle dimension to a minimum particle dimension of the particulate filler material is greater than or equal to 250:1. In other embodiments having metal-based particulate filler materials, this aspect ratio is greater than or equal to 50:1. In some embodiments having carbon-based particulate filler materials, this aspect ratio is greater than or equal to $10^{5:1}$. In other embodiments having carbon-based particulate filler materials, this aspect ratio is greater than or equal to 1000:1. In still other embodiments having carbon-based particulate filler materials, this aspect ratio is greater than or equal to 250:1. These maximum and minimum particle dimensions may refer to the nominal or average particle dimensions of a quantity of particulate filler material rather than to every individual particle of such filler material.

It is not necessary that the entirety of the filler material be conductive. In some embodiments, suitable filler particles are coated with conductive materials (e.g. otherwise non-conductive microparticles or nanoparticles coated with a metallic layer, such as silver, gold, platinum or copper). In some embodiments, the particulate filler material may comprise semiconductor-based microparticles or nanoparticles alone or in combination with metal-based and/or carbon-based microparticles or nanoparticles. Non-limiting examples of suitable semiconductor-based microparticles or nanoparticles include: boron, silicon, germanium, selenium, cadmium selenide, cadmium sulfide, cadmium telluride, zinc selenide, zinc sulfide, zinc telluride, lead sulfide, lead telluride, tin sulfide, tin telluride, aluminium phosphide, boron nitride, boron phosphide, boron arsenide, gallium antimonide, gallium arsenide, gallium nitride and the like.

In general, there is a trade-off related to the amount of particulate filler material used. As explained in more detail below, the particular filter concentration is desirably higher than a percolation threshold concentration, so as to achieve acceptably high electrical conductivity. However, excessive amounts of particulate filler material can counteract the flexibility of the resultant material and structures fabricated therefrom and can add to the weight of the resultant material and structures fabricated therefrom. The inventors have demonstrated that the addition of the conductive polymer additive to the composition of thermosetting polymer and particulate filler material dramatically reduces the percolation threshold concentration and permits correspondingly lower concentrations of particulate filler materials. In particular embodiments having metal-based particulate filler materials, the concentration of particulate filler material in the resultant electrically conductive, thermosetting elastomeric material is less than 30% weight. In other embodiments having metal-based particulate filler materials, the concentration of particulate filler material in the resultant electrically conductive, thermosetting elastomeric material is less than 15% weight. In still other embodiments having metal-based particulate filler materials, the concentration of particulate filler material in the resultant electrically conductive, thermosetting elastomeric material is less than 10% weight. In particular embodiments having carbon-based particulate filler materials, the concentration of particulate filler material in the resultant electrically conductive, thermosetting elastomeric material is less than 5% weight. In other embodiments having carbon-based particulate filler materials, the concentration of particulate filler material in the resultant electrically conductive, thermosetting elastomeric material is less than 2% weight.

In particular embodiments, the conductive polymer additive may comprise one or more conductive polymers including but not limited to:
- poly(3,4-ethylenedioxythiophene) (PEDOT);
- PEDOT doped with poly(styrenesulfonate) (PEDOT/PSS);
- polyaniline;
- poly(pyrrole);
- poly(acetylene);
- poly(thiophene);
- poly(p-phenylene sulfide);
- poly(para-phenylene vinylene) (PPV);
- polyindole;
- polypyrene;
- polycarbazole;
- polyazulene;
- polyazepine;
- polynaphthalene;
- other conjugated polymers;
- derivates of these materials; and/or
- the like.

In some embodiments, the conductive polymer may comprise the monomer ethylenedioxythiophene (EDOT) which may be subsequently polymerized to provide PEDOT. This polymerization of EDOT to provide PEDOT may carried out electrochemically or with an oxidizing agent such as an iron(III) salt, for example. Families of suitable conductive polymer products containing EDOT, PEDOT and/or PEDOT/PSS are marketed by HC Stark under the tradenames Baytron™ FHC and Clevios™ and by Agfa under the tradename Orgacon™. A suitable family of conductive polymer products containing polyaniline is marketed by Fibron Technologies under the tradename nPAC™. The above-listed conductive polymers represent non-limiting examples of suitable conductive polymers which may be used in conjunction with particular embodiments. In other embodiments, other suitable conductive polymers may be used.

In addition to an initially substantially non-conductive base polymer, a conductive particulate filler and a conductive polymer additive, particular embodiments make use of an optional diluting agent. By way of non-limiting example, a suitable diluting agent may comprise heptane, hexane or toluene. Particular embodiments may also employ a suitable curing agent to promote curing of the electrically conductive, thermosetting elastomeric materials during the preparation process as described below. In such embodiments, curing agents are preferably chosen based on their compatibility with corresponding thermosetting base polymers. Different base polymers may react with different curing agents. Some base polymers, such as Sealant 734™, may not require any curing agent. Curing agents, although not required, may optionally be used to speed up the curing process. Curing agents are also known in the art as crosslinking agents.

Another aspect of the invention provides an electrically conductive, thermosetting elastomeric compositions comprising suitable combinations of: an initially substantially non-electrically conductive, thermosetting base polymer; and a metal-based particulate filler (e.g. metal-based microparticles or nanoparticles) wherein an aspect ratio of a maximum dimension to a minimum dimension of the metal-based particulate filler is greater than or equal to 50:1. In some embodiments, this aspect ratio is greater than or equal to 250:1. The non-conductive, thermosetting base polymer and conductive particulate filler may be mixed substantially homogeneously. The non-conductive, thermosetting base polymer may have features similar to the non-conductive, thermosetting base polymer described above. Other than for being metal-based and its particulate aspect ratio, the particulate filler material may have features similar to the particulate filler material described above. In some embodiments, the composition further comprises a conductive polymer additive. In some embodiments, the composition may further comprise a curing agent, a diluting agent or both.

Particular embodiments provide methods for preparing electrically conductive thermosetting elastomeric materials. Such methods may generally comprise: mixing a non-conductive base polymer, a conductive particulate filler, a conductive polymer additive and, optionally, a diluting agent and/or curing agent together; and then thermally curing the mixture. Mixing is desirable to achieve a composition that is substantially homogeneous (at least on a macroscopic scale). Non-limiting exemplary methods for mixing the constituent materials include manual stirring, mechanical mixing (e.g. shear mixing, ball milling, magnetic mixing) and ultrasonic mixing. In some embodiments, where the composition comprises carbon-based particulate filler materials, the portions of the carbon-based particles can be functionalized (e.g. using surfactants or the like). Functionalization of carbon-based particles can have the effect of causing the carbon-based particles to repel one another in a manner which promotes homogeneity in the corresponding composition. Functionalization of carbon-based particles may occur in addition to or as an alternative to other methods of mixing the constituent materials.

In particular embodiments, thermally curing the mixture may occur at temperatures less than or equal to 300° C. In some embodiments, thermally curing the mixture may occur at temperatures less than 150° C. In still other embodiments, thermally curing the mixture may occur at room temperature (e.g. at temperatures less than 25° C.). Heat may be used to promote relatively rapid thermal curing. By way of non-limiting example, in particular embodiments where the thermosetting base polymer comprises Sealant 734™, thermal curing may occur over a number of hours at room temperature, but heat can be applied to thermally cure the mixture in a number of minutes. The application of heat may similarly decrease the curing times for mixtures comprising other base polymers. Advantageously, the mixture of the constituent materials may be moldable. Accordingly, some preparation methods further comprise the step of molding or micromolding the mixture prior to or during curing to provide a resultant conductive elastomeric structure having desired shapes and/or other characteristics. Such micromolding techniques may be referred to as soft lithography. More detailed example methods for preparing particular conductive thermosetting elastomeric materials and micromolding techniques are provided below.

Addition of the conductive particulate filler material and conductive polymer additive to the initially non-conductive, thermosetting base polymer in accordance with the compositions and methods described herein can produce an elastomeric material that is highly electrically conductive and flexible, light weight and uses a relatively small amount of particulate filler material to achieve percolation. With respect to electrical conductivity, electrically conductive, thermosetting elastomeric compositions according to particular example embodiments comprising metal-based particulate filler materials provide volume resistivity less than 0.05 Ω·m. In other embodiments comprising metal-based particulate filler materials, this volume resistivity is less than 0.025 Ω·m. In still other embodiments comprising metal-based particulate filler materials, this volume resistivity is less than 0.01 Ω·m. Particular example embodiments comprising carbon-based particulate filler materials provide volume resistivities less than $25\times10^3$ Ω·m.

Figure 1B:
Figure 1C:
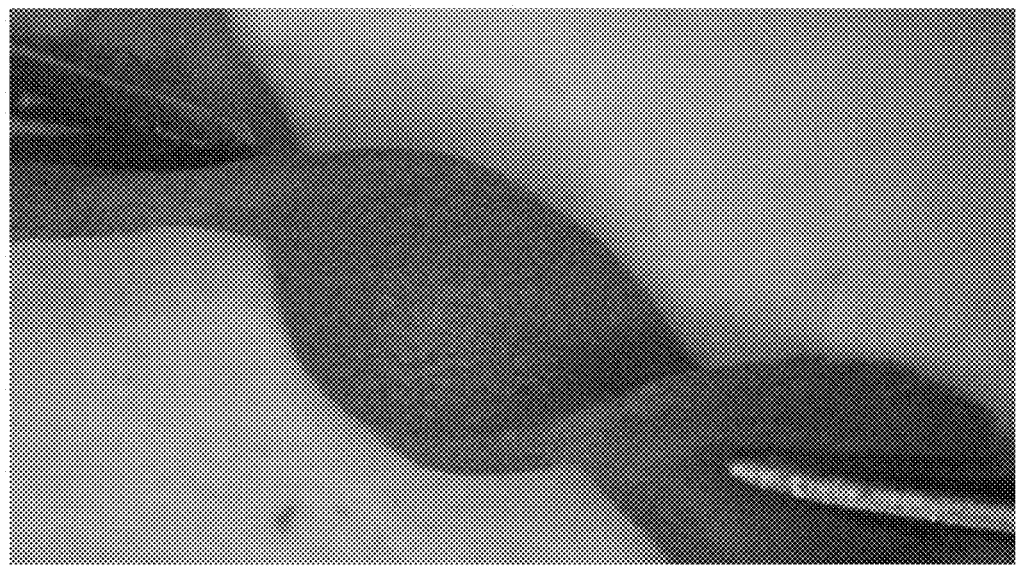

With respect to flexibility, example embodiments have exhibited the ability to be twisted, folded over double and stretched to a high degree without substantial degradation of their conductivities. This flexibility is shown in FIGS. 1A, 1B and 1C which respectively show photographs of a sample structure fabricated from an electrically conductive, thermosetting elastomeric composition according to particular example embodiment. The particular sample structure shown in FIGS. 1A, 1B and 1C has dimensions on the order of 2 mm×600 µm×500 µm at normal temperature and pressure (NTP) conditions. As used in this description, NTP conditions comprise temperatures of about 20° C.±2° C. and atmospheric pressures of about 1 atm±0.1 atm. FIG. 1A shows the sample at NTP conditions in a non-stressed state. FIG. 1B shows the same sample folded over double and FIG. 1C shows the same sample under torsion (stretched and twisted). The sample material shown in FIGS. 1A, 1B and 1C was prepared using an initially non-conductive base elastomer of Sealant 734™ and a conductive polymer additive of PEDOT at a 1:1 weight ratio and a particulate filler comprising generally spherical silver nanoparticles having average dimensions of 80-500 nm. The concentration of silver nanoparticles in the sample material of FIGS. 1A, 1B and 1C was 35% (by weight). The resistivity of the sample used in FIGS. 1A, 1B and 1C was on the order of $1.25\times10^{-3}$ Ω·m.

Structures fabricated from electrically conductive, thermosetting elastomeric compositions according to particular embodiments are capable of stretching up to 20% above their NTP dimensions without substantial increase in resistivity. In other embodiments, structures fabricated from electrically conductive, thermosetting elastomeric compositions are capable of stretching up to 50% above their NTP dimensions without substantial increase in resistivity. In some embodiments, structures fabricated from electrically conductive, thermosetting elastomeric materials are capable of stretching up to 20% above their NTP dimensions while maintaining resistivities less than 10 Ω·m. In some embodiments, electrically conductive, thermosetting elastomeric materials are capable of stretching up to 20% above their NTP dimensions while maintaining resistivities less than 5 Ω·m. The degree to which resistivity is affected by stretching is described in more particular detail below (see FIG. 5).

Table 1 below shows experimental data for the volume resistivity and flexibility (measured as a percentage of stretching over the material's ambient dimension at NTP conditions) for compositions according to various example embodiments of the invention. In each of the Table 1 examples, the non-conductive base polymer and PEDOT conductive polymer additive were mixed in a 1:1 ratio with a sufficient amount of particulate filler material to be over the percolation threshold (the percolation threshold is described in more detail below). The stretching percentage shown in Table 1 corresponds to the percentage stretching where the sample exhibits structural damage or a rapid increase in resistivity. The Table 1 resistivity was measured at NTP conditions.

TABLE 1

Volume Resistivity and Stretching Percentage of Various Compositions

| # | Composition | Volume Resistivity | Stretching % |
|---|---|---|---|
| 1 | elastomer (Sealant 734 ™) and PEDOT in a weight ratio of 1:1 with carbon black particulate filler (average dimensions on the order of hundreds of microns) | $22 \times 10^3$ Ω·m | 25% |
| 2 | elastomer (Sealant 734 ™), and PEDOT in a weight ratio of 1:1 with graphite particulate filler | $15 \times 10^3$ Ω·m | 25% |
| 3 | elastomer (Sealant 734 ™) and PEDOT in a weight ratio of 1:1 with silver flakes (average volume 0.9-9 µm³) particulate filler | $24 \times 10^{-3}$ Ω·m | 22% |
| 4 | elastomer (Sealant 734 ™) and PEDOT in a weight ratio of 1:1 with silver nanoparticles (average dimension 80-500 nm) particulate filler | $1.25 \times 10^{-3}$ Ω·m | 20% |
| 5 | contact cement (LePage ™ Pres-Tite ™) and PEDOT in a weight ratio of 1:1 with silver flakes (average volume 0.9-9 µm³) particulate filler | $8 \times 10^{-3}$ Ω·m | 25% |
| 6 | contact cement (LePage ™ Pres-Tite ™) and PEDOT in a weight ratio of 1:1 with silver nanoparticles (average dimension 80-500 nm) particulate filler | $1 \times 10^{-3}$ Ω·m | 22% |
| 7 | elastomer (Sealant 734 ™) and PEDOT in a weight ratio of 1:1 with silver nanoparticles (average dimension 80-500 nm) and silver flakes (average volume 0.9-9 µm³) particulate filler | $20 \times 10^{-3}$ Ω·m | 80% |

The particular brand of contact cement used in the Table 1 experiments was LePage™ Pres-Tite™ contact cement sold by Henkel Corporation Canada, which may comprise solvent naptha (petroleum), magnesium oxide, 2-butanone and toluene. The elastomer used in the Table 1 experiments was Sealant 734™ which may comprise ethyltriacetoxysilane, methyltriacetoxysilane, decamethylcyclopentasiloxane, octamethylcyclotetrasiloxane, acetic anhydride, acetic acid and/or dipropyl methane. The Table 1 samples were prepared by ultrasonically mixing the initially non-conductive base polymer (e.g. contact cement or Sealant 734™ elastomer) with a diluting agent for approximately 30-60 seconds. The conductive polymer (Baytron™ FHC (PEDOT)) was used for all the Table 1 experiments) and particulate filler material(s) were then added and ultrasonically mixed for 60-90 seconds. The resultant mixtures were then poured into molds having dimensions of 25 mm×25 mm×2 mm and allowed to cure (e.g. by leaving the compositions to cure under NTP conditions or by heating to compositions at temperatures less than about 120° C.).

Figure 2:
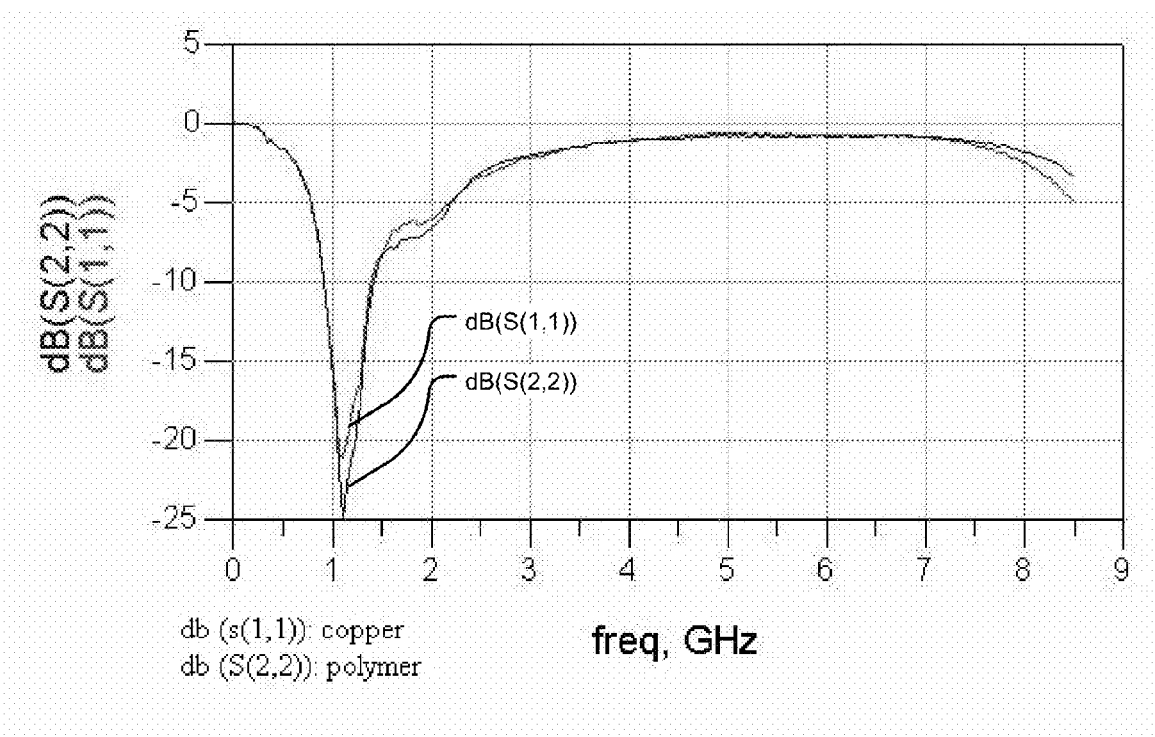
FIG. 2 is a plot illustrating the AC electrical properties (frequency response) of an electrically conductive, thermosetting elastomeric material according to a particular example embodiment and comparing the frequency response to that of copper.

Electrically conductive, thermosetting elastomeric compositions according to particular embodiments of the invention exhibit low resistivity over a wide range of frequencies. FIG. 2 shows a plot of the AC frequency response (from 0-8 GHz) at NTP conditions of an electrically conductive thermosetting elastomeric material according to a particular embodiment (Table 1, composition #4), together with a plot of the AC frequency response of copper. It can be seen that the frequency response of the sample electrically conductive, thermosetting elastomeric material is comparable to that of copper.

Figure 3:
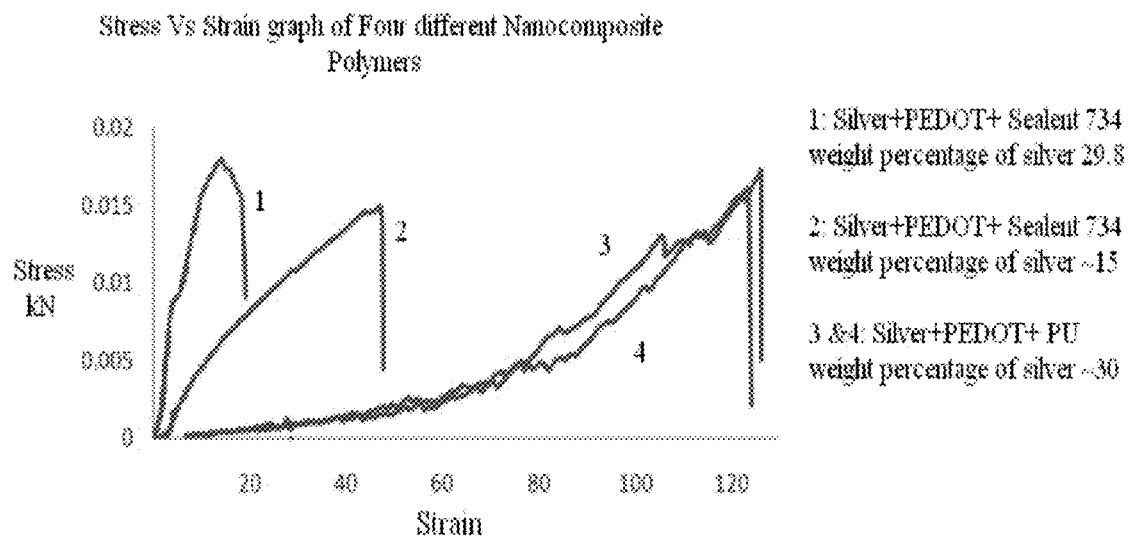
FIG. 3 shows a number of plots illustrating the stress-strain curves of four structures fabricated from corresponding exemplary electrically conductive, thermosetting elastomeric compositions according to particular embodiments of the invention.

FIG. 3 shows a number of plots illustrating the stress-strain curves of four exemplary electrically conductive, thermosetting elastomeric sample materials according to particular embodiments of the invention. These stress-strain curves show the relationship between the stress applied to a sample (measured as the force used to stretch the sample) and the strain (measured as the elongation of the sample as a percentage of its length under NTP conditions). The particular sample materials shown in the FIG. 3 plots comprise:

plot #1—elastomer (Sealant 734™) and PEDOT mixed in a weight ratio of 1:1 with approximately 30% weight of generally spherical silver nanoparticles with average dimensions of 80-500 nm;

plot #2—elastomer (Sealant 734™) and PEDOT mixed in a weight ratio of 1:1 with approximately 15% weight of generally spherical silver nanoparticles with average dimensions of 80-500 nm;

plot #3—polyurethane and PEDOT mixed in a weight ratio of 1:1 with approximately 30% weight of generally spherical silver nanoparticles with average dimensions of 80-500 nm; and plot #4—polyurethane and PEDOT mixed in a weight ratio of 1:1 with approximately 30% weight of generally spherical silver nanoparticles with average dimensions of 80-500 nm.

As can be seen in FIG. 3, samples using the elastomer (Sealant 734™) base material (e.g. plot #2) can be stretched up to 40% above their NTP dimensions and samples using the polyurethane base material (e.g. plots #3 and #4) can be stretched up to 120% above their NTP dimensions.

Figure 4:
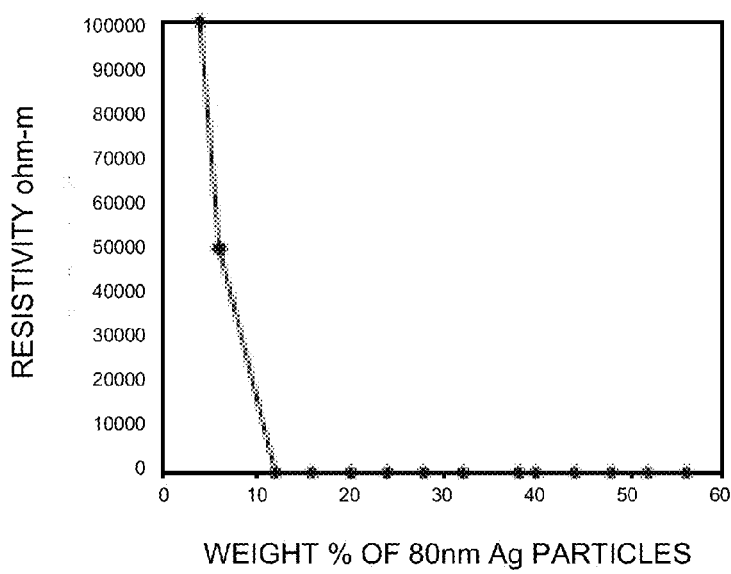
FIG. 4 is a plot illustrating the correlation between particulate filler concentration (by weight) and volume resistivity of a structure fabricated from an electrically conductive, thermosetting elastomeric composition according to an exemplary embodiment of the invention.

FIG. 4 is a graph illustrating the change in direct current volume resistivity of structures fabricated from electrically conductive, thermosetting elastomeric compositions according to particular embodiments as a function of the concentration of conductive particulate filler. The particular composition used to generate the FIG. 4 plot comprised a non-conductive base polymer of Sealant 734™ and a conductive polymer additive of PEDOT mixed in a 1:1 weight ratio with various concentrations of 80-500 nm (average dimension) generally spherical silver nanoparticle filler (measured as weight percentage). The data points used in the FIG. 4 plot are reproduced in Table 2 below. While FIG. 4 and the associated Table 2 data points are data for particular constituent materials (e.g. Sealant 734, PEDOT and generally spherical silver nanoparticles), the shape and general characteristics of the FIG. 4 resistivity curve are representative of similarly shaped resistivity curves for compositions comprising other combinations of constituent materials. In the particular case of the FIG. 4 sample, it may be observed that for concentrations of up to 8% by weight of particulate filler, the resistivity is relatively high (e.g. on the order of $10^4$ $\Omega \cdot m$ or higher). However, with higher particulate filler concentrations, the resistivity decreases rapidly and remains low (e.g. less than 100 $\Omega \cdot m$)—i.e. there is a stark transition between the relatively non-conductive state and the conductive state which depends on the concentration of particulate filler material. The concentration of particulate filler material required for insulator-conductor transition may be referred to as the threshold concentration or percolation threshold. The percolation threshold is approximately 8% weight in the illustrated example of FIG. 4. For the particular case of the FIG. 4 constituent materials, a significantly low resistivity of 11 $\Omega \cdot m$ is achieved at concentrations of silver nanoparticles as low as 12% weight.

TABLE 2

Resistivity v. % Weight of Particulate Filler (FIG. 4)

| Resistivity ($\Omega \cdot m$) | % Weight |
|---|---|
| $10^5$ | 5 |
| $5 \times 10^4$ | 8 |
| 11 | 12 |
| 8 | 15 |
| 5 | 20 |
| 3 | 25 |
| 2 | 31 |
| 1 | 39 |
| 0.8 | 40 |
| 0.6 | 44 |
| 0.4 | 48 |
| 0.2 | 52 |
| 0.09 | 56 |

In some embodiments, it is desirable to have a relatively low percolation threshold (i.e. low resistivity at a relatively low concentration of particulate filler). Benefits of a relatively low percolation threshold include: decreased weight of structures fabricated from the electrically conductive, thermosetting elastomeric composition (which is particularly advantageous in weight sensitive applications such as automotive and aerospace applications); increased flexibility of the resulting electrically conductive, thermosetting elastomeric material, as flexibility can be reduced with the addition of large amounts of particulate filler materials; and decreased cost, as particulate filler materials can be expensive. Increased flexibility allows the material to be used in applications requiring greater flexibility and strength such as, by way of non-limiting example, conductive garments for electrical measurement, RF patch antennas, microelectronics and flexible EMI shielding.

The resistivity versus particulate filler concentration curves of compositions without conductive polymer additive (i.e. comprising an initially non-conductive, thermosetting base polymer and conductive particulate filler material) look similar to that of FIG. 4. However, without the conductive polymer additive, the percolation threshold of such materials is significantly higher than the 8% weight exhibited for the FIG. 4 composition. While different compositions (which incorporate an initially non-conductive, thermosetting base polymer, conductive particulate filler material and conductive polymer additive) will have different percolation thresholds, the inventors have demonstrated that these percolation thresholds will be significantly less than they would be for similar compositions without the conductive polymer additive.

In compositions according to particular embodiments, the weight ratio of initially non-conductive, thermosetting base polymer to conductive polymer additive is in a range of 0.9:1 to 1.1:1. In some embodiments, this ratio is in a range of 0.75:1 to 1.25:1. In other embodiments, this ratio is in a range of 0.5:1 to 1.5:1. It is expected that compositions comprising relatively larger concentrations of conductive polymer additive will exhibit relatively lower percolation thresholds.

Figure 5:
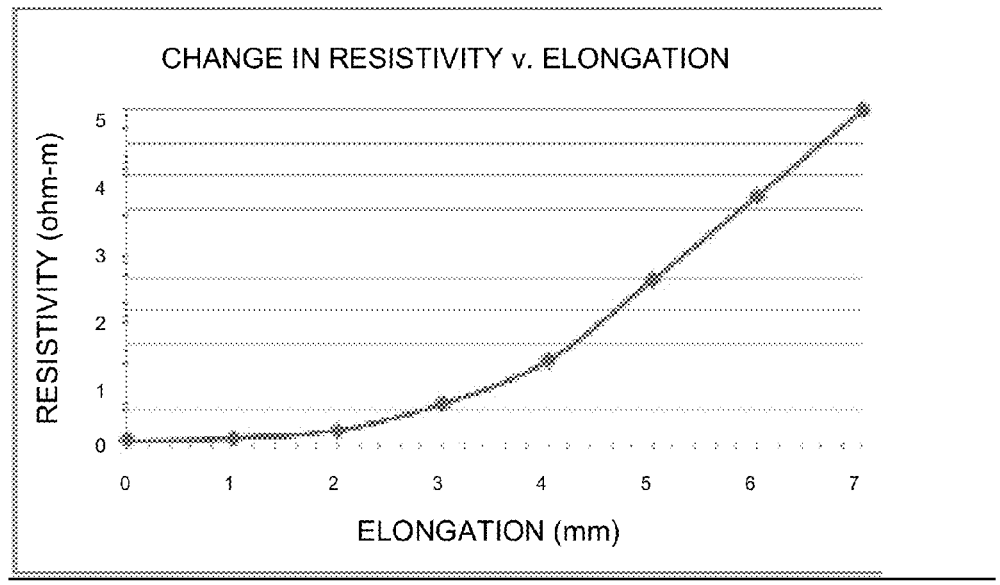
FIG. 5 is a plot illustrating the change in volume resistivity as a function of the elongation for a particular sample of an electrically conductive, thermosetting elastomeric material according to a particular embodiment of the invention.

FIG. 5 is a plot illustrating the change in volume resistivity (in $\Omega \cdot m$) as a function of the amount of stretching (in mm relative to the NTP dimensions) of a long dimension of a 25 mm×25 mm×2 mm sample structure of an electrically conductive, thermosetting elastomeric material formed according to Table 1 composition #4 with a particulate filler concentration of approximately 40% by weight Ag nanoparticles having average dimensions of 80-500 nm. The data points used in the FIG. 5 plot are reproduced in Table 3 below. FIG. 5 shows that as the sample is stretched, its resistivity increases, but after stretching by 7 mm (from 25 mm to 32 mm—i.e. a relative stretch of approximately 28% of its original dimension), the resistivity of the sample structure remains below approximately 5 Ω·m. FIG. 5 shows that structures fabricated from the electrically conductive, thermosetting elastomeric materials according to various embodiments of the invention may provide good conductivity even after considerable deformation.

TABLE 3

Resistivity v. Stretching (FIG. 5)

| Stretch (mm) | Resistivity (Ω · m) |
|---|---|
| 0 | 0.09 |
| 1 | 0.1 |
| 2 | 0.3 |
| 3 | 0.7 |
| 4 | 1.125 |
| 5 | 2.4 |
| 6 | 4.2 |
| 7 | 4.8 |

Without wishing to be bound by any theory, it is currently thought that the increased resistivity shown in FIG. 5 is attributable to the increased spacing between the particulate filler particles that results from stretching. In effect, stretching decreases the volume concentration of particulate filler materials, thereby slightly decreasing the overall conductivity of the material. The inventors theorize that as long as stretching does not reduce the effective volume concentration of particulate filler material beyond a critical point at which continuity of particulate filler materials is lost, the overall sample will remain highly electrically conductive. The inventors expect that compression of structures fabricated from the electrically conductive, thermosetting elastomeric compositions of the type described herein will cause a corresponding increase in conductivity.

Figure 9A:
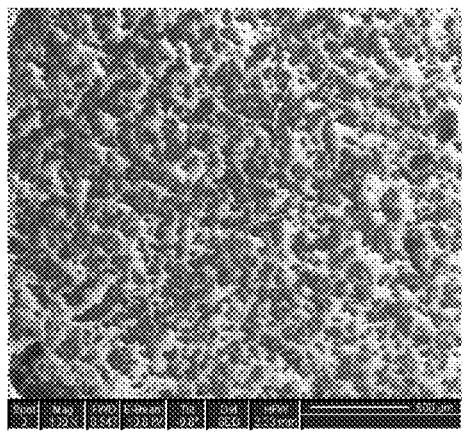
FIGS. 9A-9C are scanning electron microscope (SEM) micrographs showing surfaces of samples of electrically conducting, thermosetting elasomeric materials according to particular example embodiments at various levels of magnification.
Figure 9B:
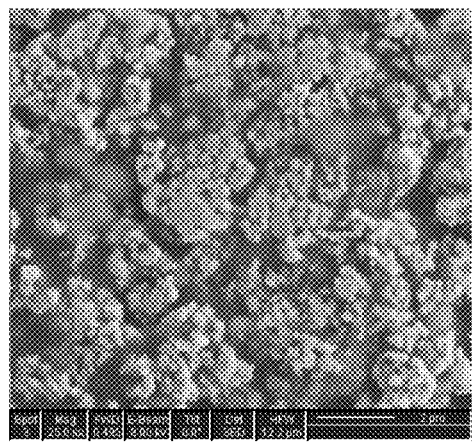
Figure 9C:
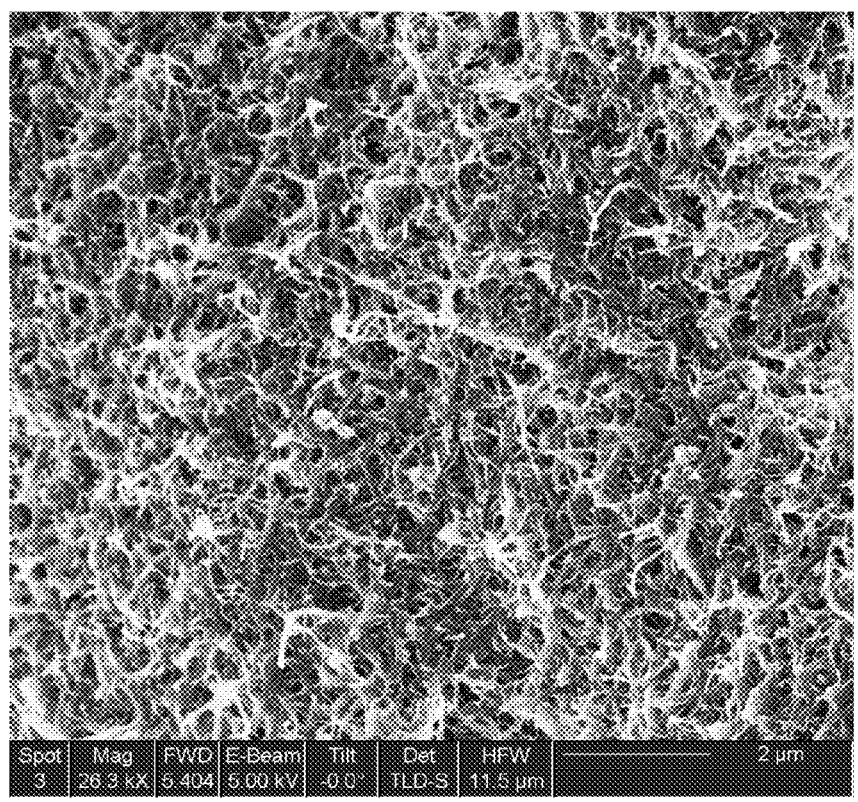

FIGS. 9A and 9B show scanning electron microscope (SEM) micrographs of an electrically conductive, thermosetting elastomer composition according to a particular embodiment of the invention. The composition used in the FIGS. 9A and 9B micrographs comprised: an initially non-conductive, thermosetting base polymer of Sealant 734™ mixed with a conductive polymer additive of PEDOT (at a 1:1 weigh ratio) with a particulate filler comprising generally spherical Ag particles having dimensions on the order of 80-500 nm and a concentration of about 50% weight. FIG. 9A is a micrograph at a magnification of approximately 130×. FIG. 9B is a micrograph at a magnification of approximately $25 \times 10^3 \times$. FIG. 9C is a similar scanning electron microscope (SEM) micrograph of an electrically conductive, thermosetting elastomer composition comprising an initially non-conductive, thermosetting base polymer of PDMS mixed with a conductive polymer additive of PEDOT (at a 1:1 weigh ratio) with a particulate filler comprising multiwalled carbon nanotubes a concentration of about 2% weight. The FIG. 9C micrograph is at a magnification of approximately $26.3 \times 10^3 \times$. FIGS. 9A-9C demonstrate that structures formed from these compositions are relatively uniform and that the particulate filler material is reasonably homogeneously dispersed in the composition.

Figure 10A:
FIG. 10A is an optical micrograph displaying micro-electrodes of various dimensions fabricated using an electrically conductive, thermosetting elastomeric composition according to a particular embodiment of the invention on a non-conductive PDMS substrate.
Figure 10B:
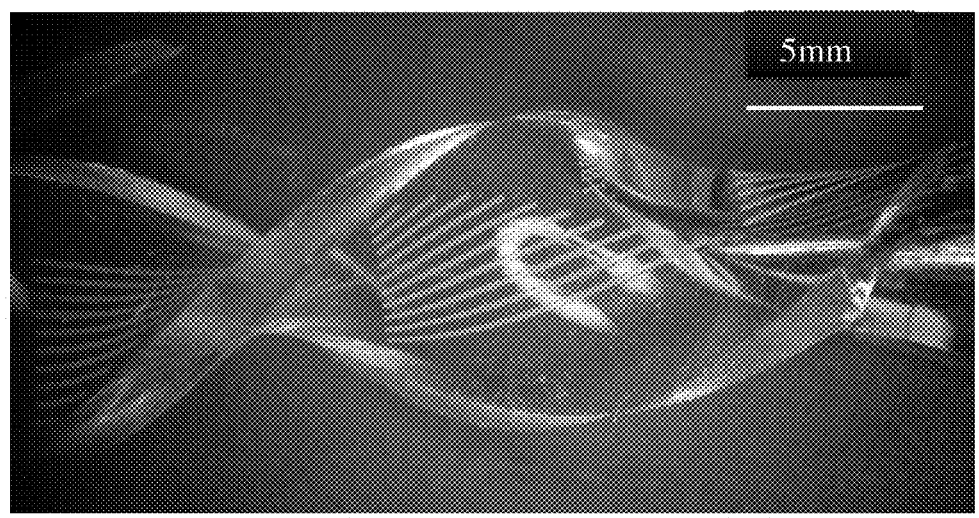
FIG. 10B is an optical micrograph showing the FIG. 10A micro-electrodes and the PDMS substrate in a twisted state to demonstrate their flexibility.

FIG. 10A is an optical micrograph displaying micro-electrodes of various dimensions fabricated using an electrically conductive, thermosetting elastomeric composition according to exemplary embodiments of the invention fabricated on a non-conductive PDMS substrate. FIG. 10B is an optical micrograph showing the FIG. 10A micro-electrodes and the PDMS substrate in a twisted state to demonstrate their flexibility. The micro-electrodes in the FIGS. 10A and 10B micrographs have heights of 30 µm, widths of 100 µm and lengths ranging from 1 mm-10 mm.

The thermosetting quality of the elastomeric conductive materials provided by the various embodiments of this invention make them particularly amenable to being molded and micromolded. Micromolding refers to the molding of features measured on the micrometer to nanometer scale. In some embodiments, micromolding can involve feature sizes of less than 1000 µm. In some embodiments, micromolding can involve feature sizes of less than 1000 nm. Various techniques of micromolding are known in the art, such as for example, soft lithography techniques which involve lithographically patterning a mold, introducing the material to and curing the material in the mold and peeling the cured material out of the mold. Thermosetting elastomers are suitable for molding because they are usually liquid or malleable prior to curing (allowing them to conform to any mold shape), but then transform into a stronger solid form upon curing. Because the curing process is generally irreversible, thermosetting elastomers do not soften on subsequent heating (as opposed to thermoplastic elastomers that may lose their solidity and shape when reheated). Other advantages of thermosetting elastomers relative to thermoplastics are that thermosetting elastomers tend to be stronger and more durable than thermoplastic elastomers and thermosetting elastomers tend to be easier to micromold than thermoplastic elastomers.

Figure 11A:
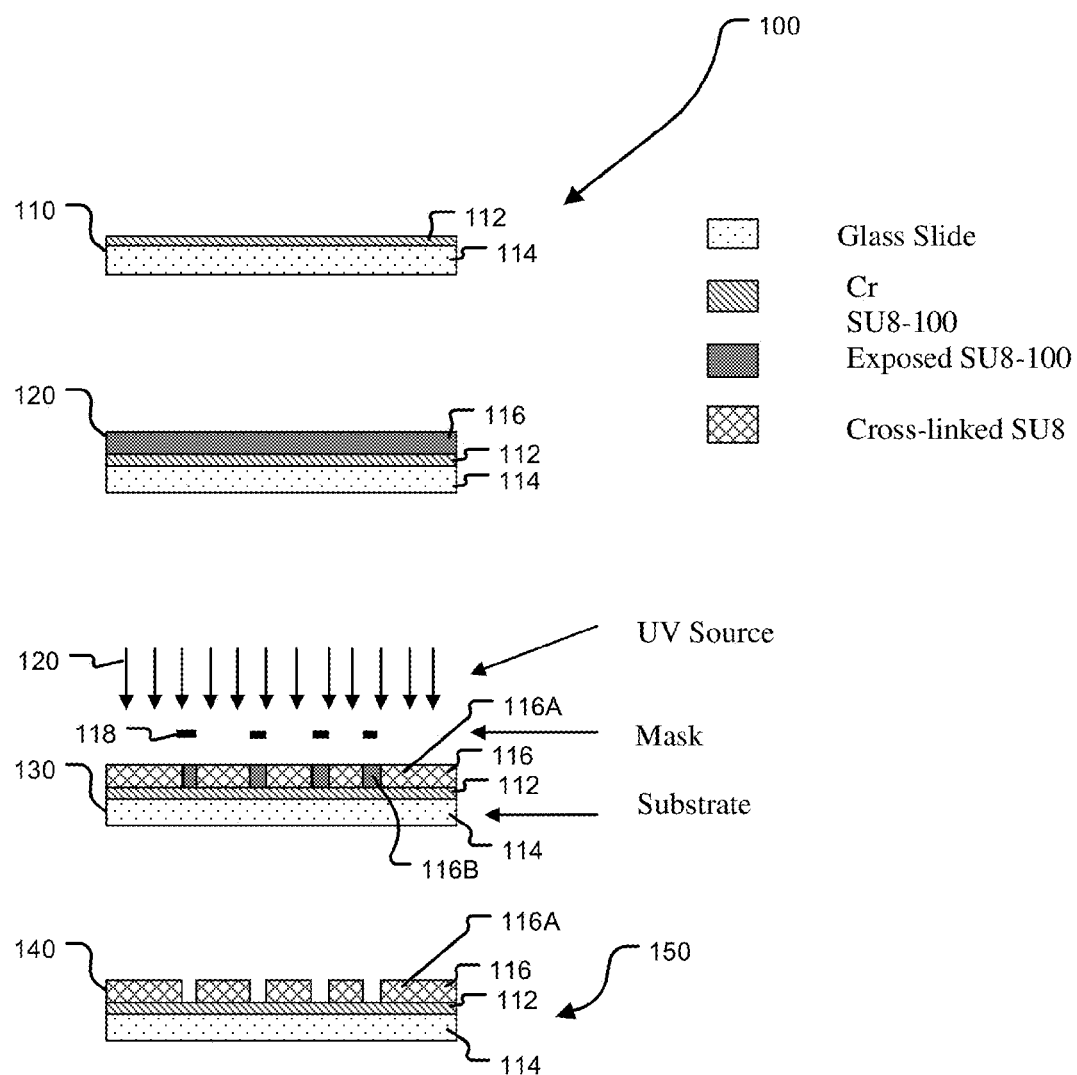
FIG. 11A schematically depicts an example method for fabricating a micromold which may be used to fabricate structures using electrically conductive, thermosetting elastomeric compositions according to particular embodiments of the invention.

FIG. 11A schematically depicts an example method 100 for fabricating a micromold 150 which may subsequently be used to fabricate structures using electrically conductive, thermosetting elastomeric compositions according to particular embodiments of the invention. Method 100 involves techniques which may be referred to as soft lithography.

In the exemplary illustrated embodiment, method 100 commences at step 110 which involves deposition of an adhesion layer 112 onto a substrate 114. In the illustrated embodiment, substrate 114 comprises glass, although other suitable materials could be used for substrate 114. In the illustrated embodiment, adhesion layer 112 comprises chromium which adheres to both the glass of substrate 114 and the SU-8 of photoresist 116, although this is not necessary and adhesion layer 112 could comprise other materials (e.g. other metals, other metal alloys or compounds or other materials that could adhere to both substrate 114 and photoresist 116). By way of non-limiting example adhesion layer 112 may be applied to substrate 114 by sputtering, electron beam deposition or other suitable vacuum deposition technique.

In step 120 of the exemplary method 100, a layer 116 of UV sensitive photoresist material is coated atop metalization layer 112. In particular embodiments, UV sensitive photoresist 116 may comprise an epoxy based resin, such as SU-8 or the like, for example. In particular embodiments, photoresist material may be applied by spin coating, but other deposition techniques (e.g. casting) could be used. Such deposition techniques may depend on the type of photoresist material used. Photoresist 116 may be applied at any suitable thickness which may depend on the application to which the resultant mold is to be used. In particular embodiments, the thickness of photoresist 116 may be in a range of 50 µm-100 µm, although this is not necessary and photoresist 116 may be applied in any suitable thickness. In step 120, the structure (e.g. including substrate 114, adhesion layer 112 and photoresist layer 116) may be baked or otherwise heated (e.g. on a hotplate). The heating temperatures and durations may depend on the type of photoresist material in photoresist layer 116 and on the type of heating apparatus. In particular embodiments, the structure may be heated on a hotplate at temperatures in a range of 75°-115° C. for a duration of 60-100 minutes.

In block 130 a patterned mask 118 is interposed between photoresist 116 and a source of UV radiation 122. Mask 118 is patterned to provide region(s) which are transparent to UV radiation and region(s) which are opaque to UV radiation. The result is that some regions 116A of photoresist 116 are exposed by the UV radiation and other regions 116B of photoresist 116 remain unexposed. Exposure of regions 116A of photoresist 116 causes at least partial cross-linking of the molecular chains of photoresist 116 in exposed regions 116A or otherwise causes photoresist 116 to cure or harden in exposed regions 116A. Regions 116B of photoresist 116 that are not exposed to UV radiation remain uncured. In block 130, the structure (e.g. including substrate 114, adhesion layer 112 and photoresist layer 116) may be again baked or otherwise heated (e.g. on a hotplate). This optional block 130 post-exposure heating process may be used to ensure that photoresist is fully cross-linked in exposed regions 116A. The heating temperatures and durations may depend on the type of photoresist material in photoresist layer 116 and on the type of heating apparatus employed. In particular embodiments, the structure may be heated on a hotplate at temperatures in a range of 50°-70° C. for a duration of 50-80 minutes.

In step 140, the structure is introduced to a solvent bath or solvent is otherwise applied to the structure in a development step to remove the uncured photoresist 116 from regions 116B. In step 140, the structure may also be rinsed with isopropyl alcohol and/or de-ionized water to clean the structure. At the conclusion of step 140, the structure is ready for use as mold 150 for fabricating structures using electrically conductive, thermosetting elastomeric compositions according to various embodiments of the invention.

Mold fabrication process 100 of FIG. 11A represents one particular exemplary mold fabrication process. In other embodiments, other processes may be used to form molds. Such processes may include, by way of non-limiting example, chemical and/or laser etching processes, mechanical machining processes and/or the like. In other embodiments, molds may be fabricated from other materials. Such materials may comprise any suitable material, including, by way of non-limiting example, metals, glass, suitable plastics, epoxy based resins, silicone, silicon, clay, granite, mica and the like. It is desirable that the materials used to form the mold are not overly sensitive to the constituent materials used in the electrically conductive, thermosetting elastomeric composition. For example, where the electrically conductive, thermosetting elastomeric composition uses an organic solvent as a diluting agent, it is desirable that the materials used to form the mold not be overly sensitive to this organic solvent.

Figure 11B:
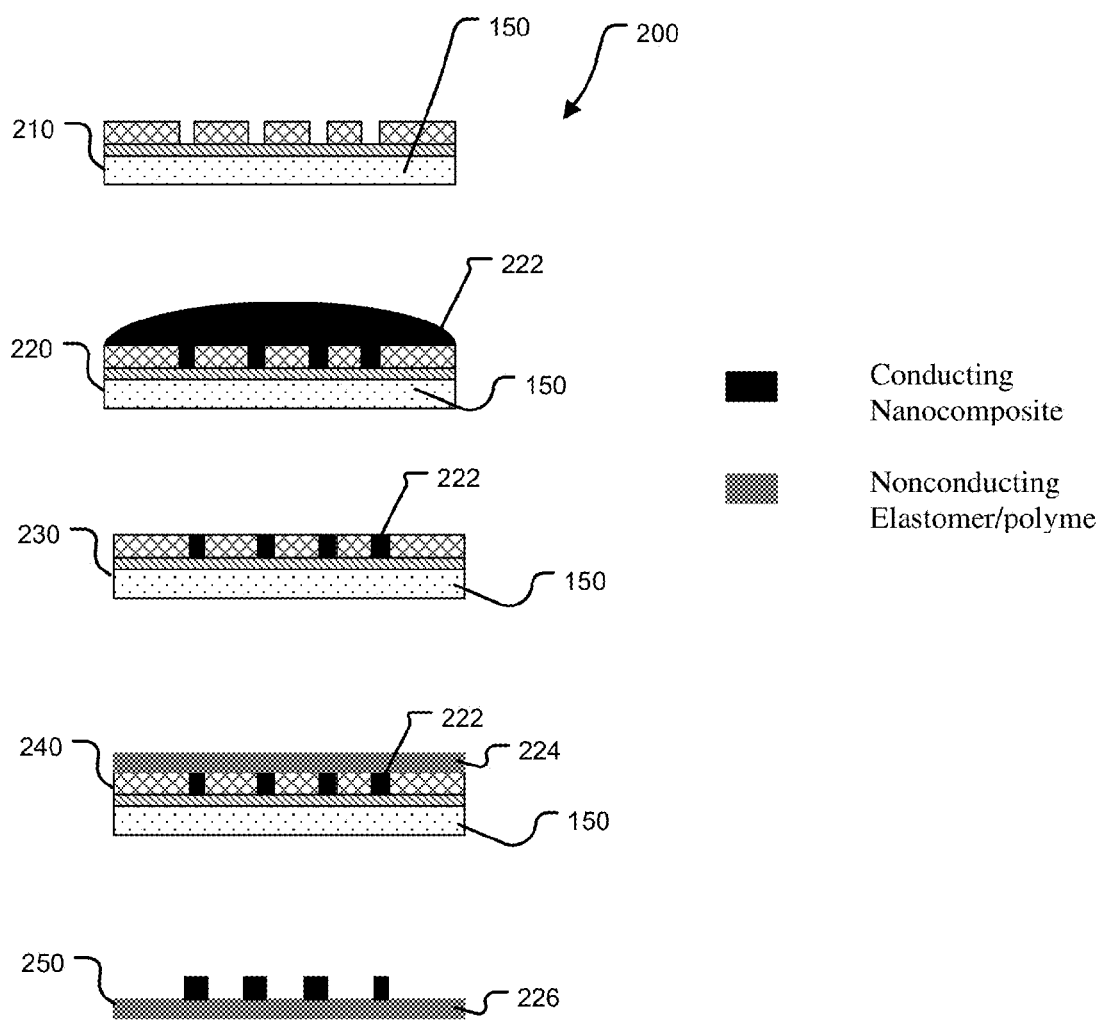
FIG. 11B schematically depicts an example method for fabricating an electrically conductive, thermosetting elastomeric structure using the FIG. 11A micromold.

FIG. 11B schematically depicts an example method 200 for fabricating an electrically conductive, thermosetting elastomeric structure using the FIG. 11A micromold 150. Method 200 involves techniques which may be referred to as soft lithography. As will be described in more detail below, method 200 involves fabrication of structures having adjacent layers of conductive and non-conductive elastomeric materials. Method 200 commences in step 210 which involves fabricating the micromold 150. Micromold 150 may be fabricated according method 100 described above, but may also be fabricated or otherwise provided according to any suitable process.

In step 220, an electrically conductive, thermosetting elastomeric composition 222 (referred to as conductive nanocomposite 222 for the purposes of describing method 200) is prepared and poured or otherwise introduced into mold 150. Typically, excess conductive nanocomposite 222 is introduced as shown in step 220, but this is not necessary. As part of step 220, conductive nanocomposite 222 may be de-gassed prior to curing to remove air bubbles. Such de-gassing may involve placing conductive nanocomposite 222 (along with mold 150) in a vacuum chamber for a period of time (e.g. 10-45 minutes). The amount of time spent de-gassing conductive nanocomposite 222 may depend on the amount of conductive nanocomposite 222 present and the properties of the vacuum chamber.

In step 230, excess conductive nanocomposite 222 is removed from mold 150. The removal of excess conductive nanocomposite 222 in step 230 may involve a Damascene-like process. The removal of excess conductive nanocomposite 222 in step 230 may involve scraping excess conductive nanocomposite 222 from the surface of mold 150 using a suitably sharp instrument such as a knife or the like. The step 230 removal of conductive nanocomposite 222 may be done before and/or after conductive nanocomposite 222 is permitted to cure. During step 230, the structure (including mold 150 and conductive nanocomposite 222) may optionally be heated to promote curing of conductive nanocomposite 222 (e.g. to make the curing of conductive nanocomposite 222 occur relatively quickly). By way of non-limiting example, mold 150 and conductive nanocomposite 222 may be baked on a hot plate at temperatures in a range of 50° C.-150° C. for times in a range of 15 minutes to 2 hours. The structure may be heated using other suitable heating implements or techniques. The particular temperatures and time ranges associated with the heating process may depend on the heat application technique and the particulars of the thermosetting material that is used to provide conductive nanocomposite 222.

In step 240, a substrate layer 224 is applied atop mold 150 and conductive nanocomposite material 22. In particular embodiments, such as the illustrated embodiment of FIG. 11B, substrate layer 224 may comprise the non-conductive thermosetting base polymer used in the composition of conductive nanocomposite 222. For example: where conductive nanocomposite 222 comprises a PDMS base polymer, substrate layer 224 may comprise non-doped (and non-conductive) PDMS; or where conductive nanocomposite 222 comprises a Sealant 734™ base polymer, substrate layer 224 may comprise non-doped (and non-conductive) Sealant 734™. For this reason, substrate layer 224 may also be referred to as a non-conductive polymer layer 224 or a non-conductive elastomer layer 224.

As part of step 240, substrate layer 224 may be de-gassed prior to curing to remove air bubbles. Such de-gassing may involve placing the structure in a vacuum chamber for a period of time (e.g. 10-45 minutes). The amount of time spent de-gassing substrate layer 224 may depend on the amount of substrate layer 224 present and the properties of the vacuum chamber. During step 240, the structure (including mold 150, conductive nanocomposite 222 and substrate layer 224) may optionally be heated to promote curing of substrate layer 224 (e.g. to make the curing of substrate layer 224 occur relatively quickly). By way of non-limiting example, the structure may be baked on a hot plate at temperatures in a range of 50° C.-150° C. for times in a range of 15 minutes to 2 hours. The structure may be heated using other suitable heating implements or techniques. The particular temperatures and time ranges associated with the heating process may depend on the heat application technique and the particulars of the material used to provide substrate layer 224.

Step 250 involves peeling the hybrid structure 226 (comprising cured substrate layer 224 and cured conductive nanocomposite 222) from mold 150.

It will be appreciated by those skilled in the art that the exemplary processes for mold fabrication (method 100 of FIG. 11A) and for fabricating structures comprising electrically conductive, thermosetting elastomeric compositions (method 200 of FIG. 11B) represent relatively simple processes for the purpose of illustrating various aspects of the invention. In other embodiments, molds may be fabricated using methods similar to method 100 but which involve multiple repetition of masking, exposing, developing and/or other steps to create multi-layer molds. Similarly, in other embodiments, structures may be fabricated from electrically conductive, thermosetting elastomeric compositions using methods similar to method 200 but which involve repetitive application of multiple layers of conductive nanocomposite and/or non-conductive polymer and/or repetition of other steps to fabricate desired structures. In this manner, layers of patterned, electrically conductive, thermosetting elastomeric materials may be embedded between non-conductive layers of thermosetting elastomeric materials for particular applications. In particular applications, vias or the like may be patterned or otherwise provided to provide conductive contact between layers of electrically conductive, thermosetting elastomeric materials that are otherwise separated by non-conductive materials. Such vias may be filled with electrically conductive, thermosetting elastomeric materials.

In still other embodiments, fabrication of the mold and forming a structure in the mold may take place in interleaving steps. For example, a first mold layer may be formed; a first structure layer (comprising an electrically conductive, thermosetting elastomeric composition layer and/or a non-conductive polymer layer) may then be introduced and cured in the first mold layer; a second mold layer may be formed against (e.g. on top of) the first mold layer and/or the first structure layer; and a second structure layer (comprising an electrically conductive, thermosetting elastomeric composition layer and/or a non-conductive polymer layer) may then be introduced and cured in the second mold layer. This process of interleaving mold and structure fabrication steps may be repeated as desired to fabricate a desired structure.

Electrically conductive, thermosetting elastomeric materials according to various embodiments of this invention may have application in many fields for which flexible and conductive moldable materials are desired. By way of non-limiting example, some potential applications of various embodiments of the invention include:

- flexible electrical interconnects (electrical lines) on a single chip or for chip to chip connection;
- integration of flexible conductive tracks for signal integration and processing in microfluidic and/or lab-on-chip systems (including wearable microfluidic devices and their associated electronics);
- micro-instrumentation, microelectronics, and microelectromechanical systems;
- all-polymer microsystems;
- miniaturized health care instrumentation—e.g. shape conforming (moldable) or deformable electrodes for impedance-based cancer/tumor detection;
- actuators based on extrinsic conducting polymers;
- flexible tactile and pressure sensors;
- bistable memory devices, in particular polymer based bistable memory devices/switches;
- RF and microwave applications such as tunable antennas, passive microwave components and conductive gaskets;
- automotive industry applications;
- wearable electronics;
- flexible resistors;
- flexible micro-electrodes for flexible electronics, lab-on-chip systems or the like; and
- microheaters.

A number of particular exemplary and non-limiting applications are now described.

Light Weight Wiring for Transportation Applications

Copper cables currently contribute to approximately 7% of an aircraft's weight and as much as one-third of the weight of a 15-ton satellite. Similarly, copper wiring may make up a significant percentage of vehicular weight for other transportation applications (e.g. spacecraft, automobiles, watercraft). Light weight cables fabricated out of the electrically conductive, thermosetting elastomeric materials described herein weigh substantially less than copper cable (e.g. on the order of ¼ of the weight of copper) and their AC and DC electrical characteristics are similar to those of bulk copper. Accordingly, cables fabricated (e.g. by molding or otherwise) from the electrically conductive, thermosetting elastomeric materials described herein may substantially reduce the weight currently contributed by copper cables.

Wearable Electronics

One example of a wearable electronic garment which may make use of the conductive elastomeric materials described herein is a flexible, electrode-embedded brassiere or the like incorporating breast-receiving cups comprising electrically conductive blastomeric material for breast cancer detection via Electrical Impedance Scanning (EIS). Such a garment may comprise an array of electrodes (formed from an electrically conductive, thermosetting elastomeric material of a type described herein) which may be embedded in or layered with an otherwise non-electrically conductive material (e.g. a non-conductive, thermosetting flexible polymer base). Individual electrodes may be electrically connected by routing wires fabricated from electrically conductive, thermosetting elastomeric materials described herein. Fabrication of the garment may be based on micromolding techniques of the type described herein and/or any other suitable fabrication technique. Arrays of a thousand or more electrodes with electronic routing can be realized via micromolding techniques. The garment can be used to locate an array of electrodes directly against a patient's breast to permit EIS in a garment that is flexible and therefore significantly more comfortable than current EIS technology.

Figure 6:
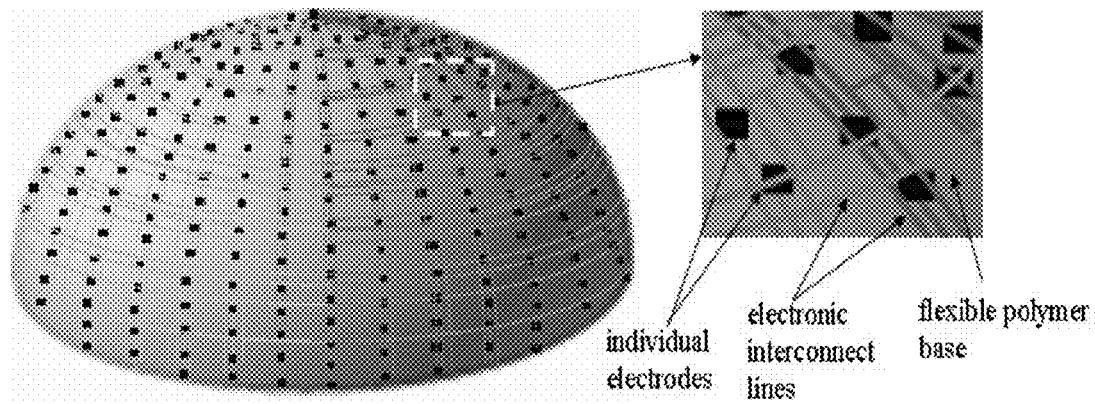
FIG. 6 is a diagram showing a portion of a garment constructed using structures fabricated from electrically conductive, thermosetting elastomeric compositions according to particular embodiments of the invention and suitable for breast cancer detection via Electrical Impedance Scanning (EIS).

FIG. 6 shows a schematic drawing of a breast cup of an EIS garment fabricated according to a particular embodiment of the invention which may be used to implement EIS testing for breast cancer. The FIG. 6 cup incorporates electrodes and interconnection lines fabricated from electrically conductive, thermosetting elastomeric materials of the types described herein and fabricated from micromolding techniques of the type described herein.

Micro-Instrumentation for Polymer-Based Lab on a Chip Applications

Electrically conductive elements may be fabricated on polymer-based substrates or other substrates using the electrically conductive, thermosetting elastomeric materials described herein. For the particular example of microfluidic applications, electrodes may be shaped (e.g. by micromolding according to the techniques described herein) to provide bores (e.g. tubular shapes) and may thereby provide flexible fluid conduits (through their bores) which may also be electrically conductive (through the material itself). Using micromolding techniques, various fluid carrying and electrically conductive structures could be connected to one another.

Figure 7A:
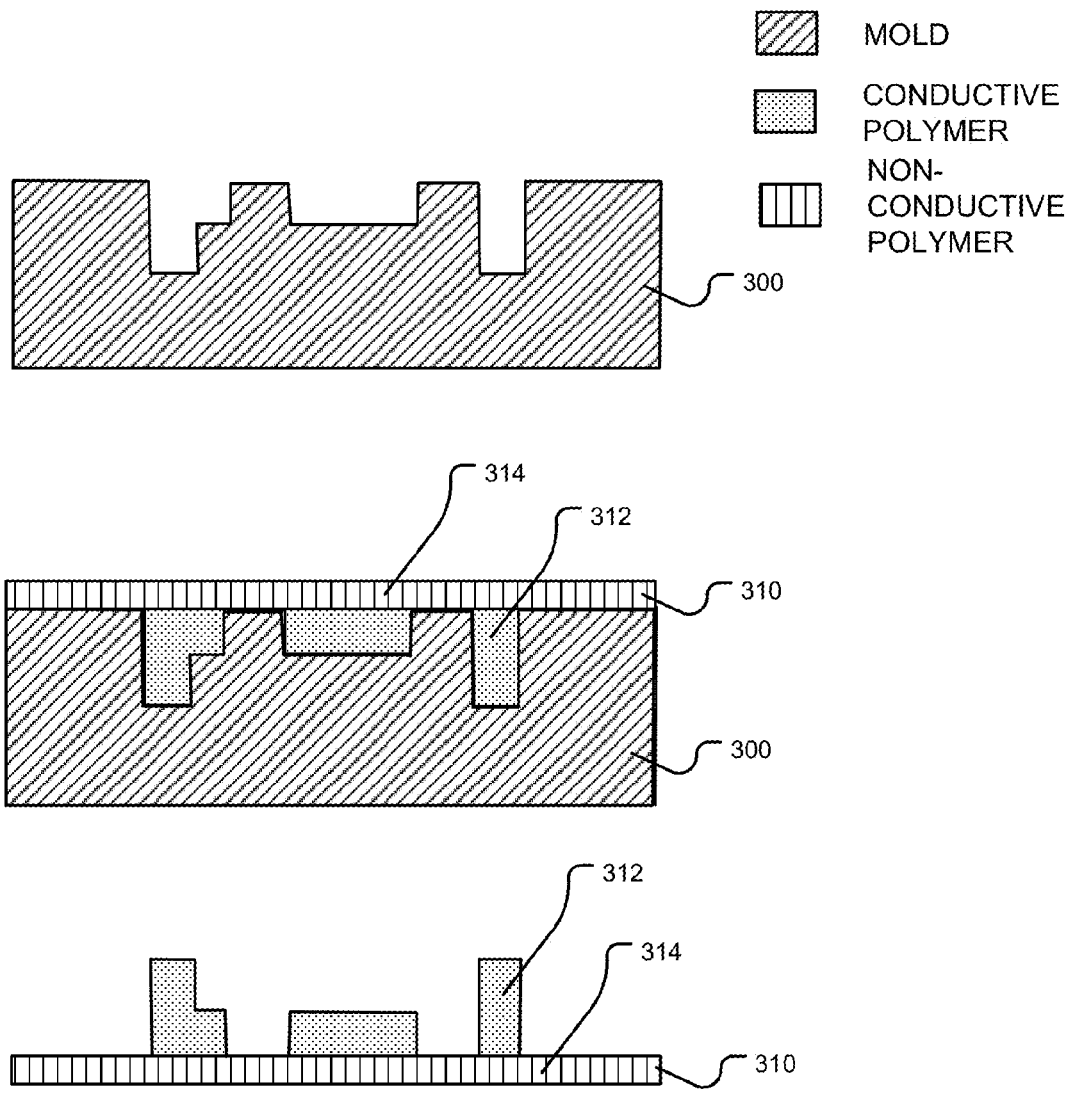
FIG. 7A is a cross-sectional diagram showing a micro-molding process for fabrication of a tubular structure comprising electrically conductive, thermosetting elastomeric compositions according to particular embodiments of the invention on a non-electrically conductive polymer substrate which may be used for lab-on-chip applications.

FIG. 7A depicts a cross-sectional view of a micromold 300 for fabricating a tubular structure 310 using electrically conductive, thermosetting elastomeric material 312 of the type described herein on a non-conductive polymer substrate 314. Mold 300 may be fabricated from a technique similar to mold fabrication technique 100 described above, except that mold 300 of the FIG. 7A embodiment comprises multiple levels and may be fabricated using a multiple level mask and/or using multiple masking, exposing and/or developing steps. Tubular structure 310 may be fabricated using a technique similar to structure fabrication technique 200 described above, wherein electrically conductive, thermosetting elastomeric material 312 is introduced into mold 300 and then cured and then non-conductive polymer material 314 is applied overtop and then cured, so that the resultant structure 300 may be peeled from mold 300.

Figure 7B:
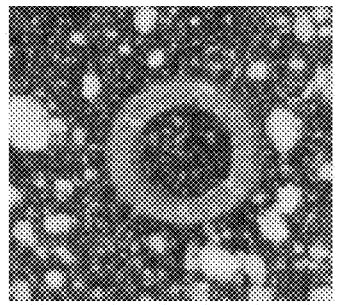
FIGS. 7B and 7C are micrographs showing example structures formed using micromolding processes similar to that of FIG. 7A.
Figure 7C:
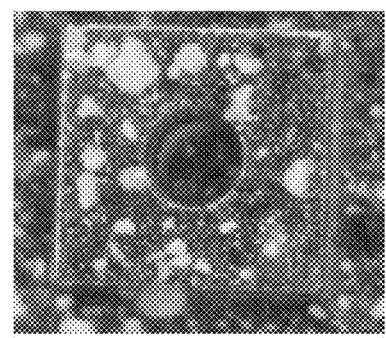

FIGS. 7B and 7C are micrographs of tubular structures fabricated using molds like mold 300 from an electrically conductive, thermosetting elastomeric composition of the type described herein. The particular composition used to provide the structures in FIGS. 7B and 7C comprises a base polymer of PDMS and a conductive polymer additive of PEDOT in a 1:1 weight ratio and a particulate filler of 80 nm-500 nm generally spherical silver nanoparticles with a concentration of about 45% weight. The FIGS. 7B and 7C structures comprise bores for containing and/or conducting fluids. The FIGS. 7B and 7C structures are also electrically conductive. In some applications, the structures of FIG. 7B, 7C and/or similar structures may be coupled to one another by extending one structure into the bore of another, for example.

Circuit Boards

Electrically conductive elements may be fabricated on polymer-based substrates or other substrates using the electrically conductive, thermosetting elastomeric materials described herein to fabricate flexible circuit boards similar to printed circuit boards (PCBs). Micromolding techniques similar to those described herein may be used to fabricate such flexible PCB-like circuit boards. FIGS. 12A-12E are micrographs of example flexible PCB-like circuit boards fabricated from such electrically conductive, thermosetting elastomeric materials using such micromolding techniques. The particular composition used to provide the structures in FIGS. 12A-12E comprises a base polymer of PDMS and a conductive polymer additive of PEDOT in a 1:1 weight ratio and a particulate filler of 80 nm-500 nm generally spherical silver nanoparticles with a concentration of about 30% weight. The substrate on which the FIG. 12A-12E PCB-like circuit boards are formed is non-conductive PDMS.

Figure 12A:
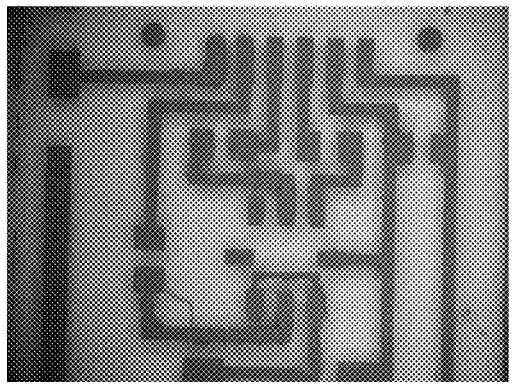
FIGS. 12A-12E are micrographs showing an example flexible PCB-like circuit board fabricated using a micromolding technique of the type described herein and comprising an electrically conductive, thermosetting elastomeric composition of the type described herein.
Figure 12B:
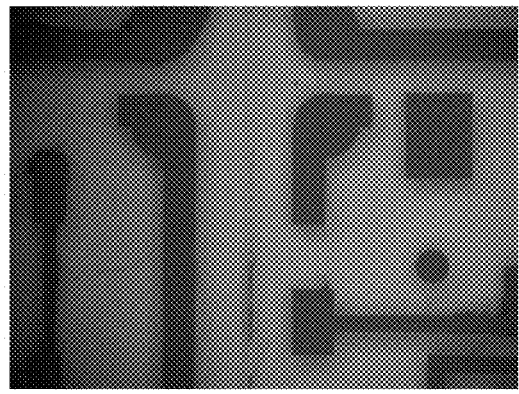
Figure 12C:
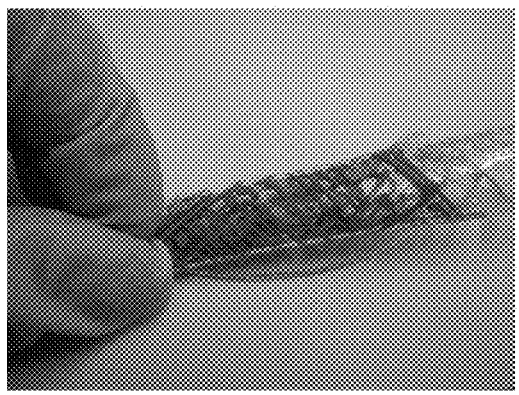
Figure 12D:
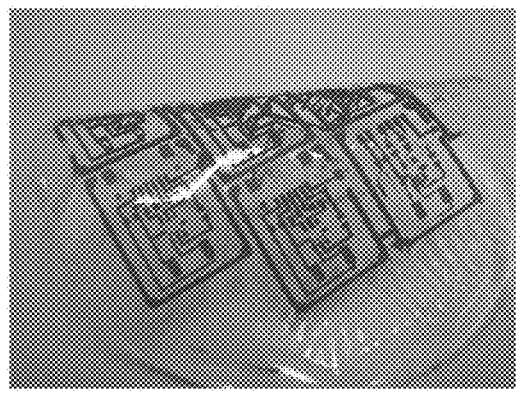
Figure 12E:
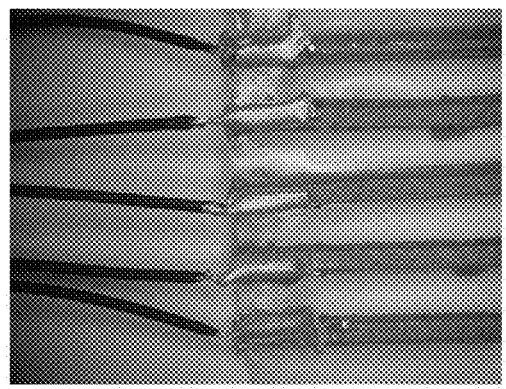

The FIG. 12A micrograph shows a portion of a PCB-like circuit board. The FIG. 12B micrograph is a magnified view of a portion of the FIG. 12A PCB-like circuit board. The micrographs of FIGS. 12C and 12D show flexibility of the resultant PCB-like circuit board. FIG. 12E shows how electrical contact can be made between conventional wires and a number of ribbon cables on the PCB-like circuit board using conductive epoxy or the like.

Some specific example embodiments of electrically conductive, thermosetting elastomeric materials and methods for their preparation are described below.

EXAMPLE 1

An example conductive thermosetting elastomeric material was prepared as follows:
  1 gram of generally spherical, 80-500 nm (average dimension) silver nanoparticles was dispersed in 2 grams of heptane using ultrasound waves for 30 seconds;
  separately, 1.5 grams of PDMS elastomer was mixed with 3 grams of Baytron™ FHC (PEDOT) conducting polymer until a uniform paste was formed;
  the above two mixtures were then manually stirred together for 3 minutes and then magnetically stirred at 1000-1500 rpm for 5 additional minutes.
  a PDMS curing agent was then added, at a ratio of 1:10 with respect to the PDMS elastomer, and the mixture was again manually stirred for 3 minutes and magnetically stirred for 5 minutes;
  the mixture (which was in liquid phase) was then either placed in a vacuum or cooled to a temperature of 0° C. for 15 minutes to remove air bubbles; and
  finally, the mixture was heated at a temperature of 70° C. for 2 hours to cure into solid thick or thin films.

It will be apparent to one skilled in the art that the elastomeric material formed by this method could be hardened into various shapes by means of suitable molding or micromolding.

A 0.5 mm thick film of this example elastomeric material was measured to have a sheet resistance of 0.05 Ω/square at NTP conditions.

EXAMPLE 2

Another example conductive thermosetting elastomeric material was formed as follows:
  1 gram of 10 nm silver particles (which may or may not be PVC coated in order to protect the particles from oxidizing when in contact with air), 5 grams of heptane, 1.5 grams of PDMS elastomer, and 3 grams of Baytron™ FHC (PEDOT) were combined in a glass beaker and manually stirred for 5 minutes;
  the mixture was then subjected to ultrasound waves for at least 60 seconds;
  a PDMS curing agent was added, at a ratio of 1:10 with respect to the PDMS elastomer, and the mixture was then manually stirred for 4 minutes and magnetically stirred for 5 minutes;
  the mixture (which was in liquid phase) was then either placed in a vacuum or cooled to a temperature of 0° C. for 15 minutes to remove air bubbles; and
  finally, the mixture was heated at a temperature of 70° C. for 2 hours to cure into solid thick or thin films.

It will be apparent to one skilled in the art that the elastomeric material formed by this method could be hardened into various shapes by means of suitable molding or micromolding.

A 0.5 mm thick film of this example elastomeric material was measured to have a sheet resistance of 0.01 Ω/square at NTP conditions.

EXAMPLE 3

A electrically conductive elastomer composition was prepared using a base polymer of PDMS and a particulate filler of multi-walled carbon nanotubes (MWCNT).

The MWCNT particles used were approximately 60-100 nm in diameter and 5-15 μm in length. MWCNT have a relatively high aspect ratio (length to radius ratio) when compared to generally spherical particles and when compared to metal-based nanorods, nanotubes and nanowires and can therefore achieve the percolation threshold at lower concentrations.

Desired quantities of PDMS, MWCNT and PDMS-crosslinking agent were carefully weighed (via digital balance) and six conductive elastomeric samples were prepared with varied MWCNT weight percentages of 0.80%, 1%, 1.5%, 2%, 2.2% and 2.5%. The combination of the PDMS, MWCNT and conductive polymer additive was first manually stirred for approximately 20 minutes and then oscillated by ultrasonic waves for approximately 40-60 seconds. The PDMS crosslinking agent was the added to the mixture in a weight ratio of 1:10. It will be appreciated that other weight ratios of PDMS-cross-linking agent could be used to achieve different result in the resultant elastomeric polymer (e.g. higher weight ratios or curing agent could be used to achieve harder resultant materials and vice versa). Finally, the resultant mixture was manually stirred again for approximately 20 minutes and again utrasonically oscillated for 30 minutes. After stirring, the mixture was placed into a vacuum chamber to remove air bubbles for 20 minutes prior to micromolding.

Figure 8:
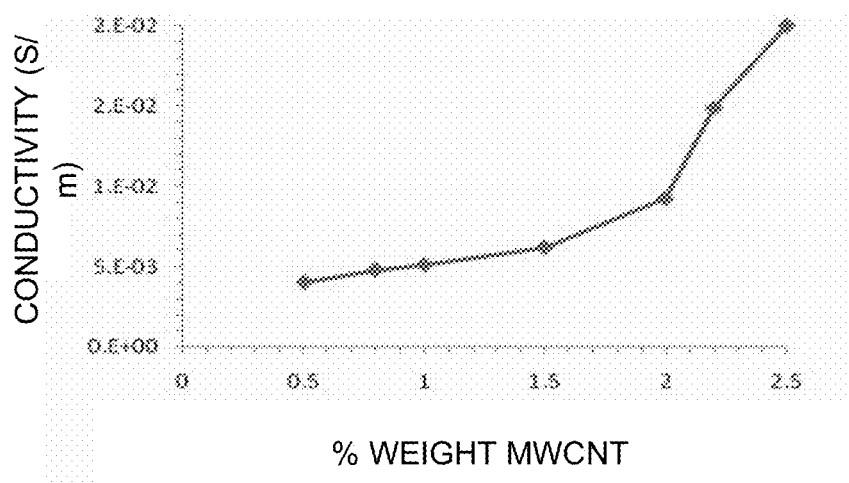
FIG. 8 is a plot illustrating the conductivity of electrically conductive, thermosetting elastomeric compositions versus a percentage weight of multi-walled carbon nanotube particulate filler.

FIG. 8 is a plot depicting electrical conductivity (in siemens/meter (S/m)) of the Example 3 compositions versus weight percentage of MWCNT.

The Example 3 experiment was conducted without any conductive elastomeric additive in the composition. Future embodiments, may also comprise conductive polymer additive (e.g. PEDOT) which is expected to increase the resultant conductivity and decrease the particulate filler weight percentage expected to achieve the percolation threshold.

While a number of exemplary aspects and embodiments have been discussed above, those of skill in the art will recognize certain modifications, permutations, additions and sub-combinations thereof.

What is claimed is:

1. An electrically conductive, thermosetting elastomeric composition, the composition comprising:
   an initially substantially non-electrically conductive, polyurethane-based thermosetting base polymer;
   a particulate filler comprising electrically conductive particles;
   and an electrically conductive polymer additive;
   wherein the non-electrically conductive, thermosetting base polymer, the particulate filler and the electrically conductive polymer additive are mixed substantially macroscopically homogeneously;
   wherein the electrically conductive polymer additive comprises one or more of: ethylenedioxythiophene (EDOT); poly(3,4-ethylenedioxythiophene) (PEDOT); PEDOT doped with poly(styrenesulfonate) (PEDOT/PSS); polyaniline; poly(pyrrole); poly(acetylene); poly(thiophene); poly(p-phenylene sulfide); poly(para-phenylene vinylene) (PPV); polyindole; polypyrene; polycarbazole; polyazulene; polyazepine; and polynaphthalene;
   and wherein the weight ratio of the non-electrically conductive thermosetting base polymer to the electrically conductive polymer additive is in a range of 0.5:1 to 1.5:1.

2. The composition according to claim 1 wherein the particulate filler comprises one or more of: metal-based microparticles, metal-based nanoparticles, carbon-based microparticles and carbon-based nanoparticles.

3. The composition according to claim 1 wherein the particulate filler comprises metal-based nanoparticles of one or more of: silver, gold, platinum, copper, nickel, aluminum, zinc, molybdenum, cadmium, scandium, titanium, vanadium, chromium, manganese, iron, cobalt, yttrium, zirconium, niobium, tantalum, tungsten, lead, indium tin oxide, terfenol-D, manganin and constantan.

4. The composition according to claim 1 wherein the particulate filler comprises carbon-based nanoparticles of one or more of: single walled carbon nanotubes, multi-walled carbon nanotubes, carbon nanorods, graphene, graphite and fullerene.

5. The composition according to claim 1 wherein the electrically conductive polymer additive comprises one or more of: poly(3,4-ethylenedioxythiophene) (PEDOT); and PEDOT doped with poly(styrenesulfonate) (PEDOT/PSS).

6. The composition according to claim 1 wherein the particulate filler comprises a metal-based particulate filler and the composition comprises a particulate filler concentration of less than 30% weight.

7. The composition according to claim 6 wherein an aspect ratio of a maximum particle dimension to a minimum particle dimension of the particulate filler is greater than 50:1.

8. The composition according to claim 7 wherein the weight ratio of the non-electrically conductive thermosetting base polymer to the electrically conductive polymer additive is in a range of 0.5:1 to 1.5:1.

9. The composition according to claim 7 wherein the weight ratio of the non-electrically conductive thermosetting base polymer to the electrically conductive polymer additive is in a range of 0.75:1 to 1.25:1.

10. The composition according to claim 6 wherein the weight ratio of the non-electrically conductive thermosetting base polymer to the electrically conductive polymer additive is in a range of 0.75:1 to 1.25:1.

11. The composition according to claim 1 wherein the particulate filler comprises a metal-based particulate filler and the composition comprises a particulate filler concentration of less than 15% weight.

12. The composition according to claim 11 wherein an aspect ratio of a maximum particle dimension to a minimum particle dimension of the particulate filler is greater than 50:1.

13. The composition according to claim 11 wherein the weight ratio of the non-electrically conductive thermosetting base polymer to the electrically conductive polymer additive is in a range of 0.5:1 to 1.5:1.

14. The composition according to claim 11 wherein the weight ratio of the non-electrically conductive thermosetting base polymer to the electrically conductive polymer additive is in a range of 0.75:1 to 1.25:1.

15. The composition according to claim 1 wherein the particulate filler comprises a carbon-based particulate filler and the composition comprises a particulate filler concentration of less than 5% weight.

16. The composition according to claim 15 wherein an aspect ratio of a maximum particle dimension to a minimum particle dimension of the particulate filler is greater than 250:1.

17. The composition according to claim 1 wherein the particulate filler comprises a carbon-based particulate filler and the composition comprises a particulate filler concentration of less than 2% weight.

18. The composition according to claim 17 wherein an aspect ratio of a maximum particle dimension to a minimum particle dimension of the particulate filler is greater than 250:1.

19. A flexible, electrically conductive structure fabricated from a cured thermosetting composition as defined in claim 1.

20. The structure according to claim 19 wherein the structure is fabricated on a flexible, electrically non-conductive substrate.

21. The structure according to claim 20 wherein the flexible, electrically non-conductive substrate comprises the non-electrically conductive, thermosetting base polymer.

22. A structure according to claim 19 comprising:
a plurality of conductive layers, each conductive layer comprising the cured thermosetting composition; and
at least one flexible, non-conductive layer interposed between a pair of adjacent conductive layers.

23. The structure according to claim 22 wherein the at least one flexible, non-conductive layer comprises the non-electrically conductive, thermosetting base polymer.

24. A structure according to claim 22 comprising one or more electrically conductive vias through the at least one flexible, non-conductive layer to provide electrical contact between the pair of adjacent conductive layers.

25. The structure according to claim 24 wherein the one or more electrically conductive vias comprise the cured thermosetting composition.

26. The structure according to claim 19 comprising:
a conductive layer comprising the cured thermosetting composition; and
a plurality of flexible, non-conductive layers at least one flexible, non-conductive layer disposed on each side of, and substantially contiguous with, the conductive layer.

27. The structure according to claim 26 wherein each of the plurality of flexible, non-conductive layers comprises the non-electrically conductive, thermosetting base polymer.

28. A method for fabricating a flexible, electrically conductive structure, the method comprising:
providing a mold;
introducing the electrically conductive, thermosetting composition as defined in claim 1 to the mold
allowing the electrically conductive, thermosetting composition to cure in the mold.

29. A method according to claim 28 comprising after allowing the electrically conductive, thermosetting composition to cure in the mold:
applying a layer of non-electrically conductive thermosetting polymer against at least a portion of the cured electrically conductive, thermosetting composition in the mold;
allowing the layer of non-electrically conductive thermosetting polymer to cure in contact with the portion of the cured electrically conductive, thermosetting composition.

30. The method according to claim 28 comprising after allowing the electrically conductive, thermosetting composition to cure in the mold:

(a) applying a layer of non-electrically conductive thermosetting polymer against at least a portion of the cured electrically conductive, thermosetting composition in the mold;
(b) allowing the layer of non-electrically conductive thermosetting polymer to cure in contact with the portion of the cured electrically conductive, thermosetting composition;
(c) introducing a second layer of the electrically conductive, thermosetting composition to the mold against at least a portion of the cured non-electrically conductive thermosetting polymer;
(d) allowing the second layer of electrically conductive, thermosetting composition to cure in contact with the portion of the cured electrically non-conductive thermosetting polymer.

31. The method according to claim 30 comprising repeating any of steps (a) through (d) to fabricate a structure comprising multiple layers of flexible electrically conductive material and multiple layers of flexible electrically non-conductive material.

32. The method according to claim 28 wherein:
providing the mold comprises iteratively fabricating a plurality of mold portions; and
introducing the electrically conductive, thermosetting composition to the mold comprises iteratively introducing a plurality of layers of the electrically conductive, thermosetting composition to the mold; and
wherein iteratively introducing a plurality of layers of the electrically conductive, thermosetting composition to the mold comprises introducing a layer of electrically conductive, thermosetting composition to each mold portion and allowing the layer of electrically conductive, thermosetting composition to cure prior to fabricating a subsequent mold portion.

33. The method according to claim 32 comprising iteratively adding one or more layers of electrically non-conductive thermosetting polymer to the structure, wherein iteratively adding one or more layers of electrically non-conductive thermosetting polymer to the structure comprises adding a layer of electrically non-conductive, thermosetting polymer against at least a portion of each layer of the electrically conductive, thermosetting composition prior to fabricating a subsequent mold portion.

* * * * *